(12) United States Patent
Cheng et al.

(10) Patent No.: US 11,434,129 B2
(45) Date of Patent: Sep. 6, 2022

(54) SEMICONDUCTOR STRUCTURE AND METHOD FOR FABRICATING THE SAME

(71) Applicant: TAIWAN SEMICONDUCTOR MANUFACTURING COMPANY LTD., Hsinchu (TW)

(72) Inventors: Chun-Wen Cheng, Hsinchu County (TW); Yi-Chuan Teng, Hsinchu County (TW); Cheng-Yu Hsieh, Hsinchu (TW); Lee-Chuan Tseng, New Taipei (TW); Shih-Chang Liu, Kaohsiung County (TW); Shih-Wei Lin, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 176 days.

(21) Appl. No.: 15/407,676

(22) Filed: Jan. 17, 2017

(65) Prior Publication Data
US 2017/0129772 A1    May 11, 2017

Related U.S. Application Data

(63) Continuation of application No. 14/935,318, filed on Nov. 6, 2015, now Pat. No. 9,567,208.

(51) Int. Cl.
*B81B 7/00* (2006.01)
*B81C 1/00* (2006.01)
*B81B 3/00* (2006.01)

(52) U.S. Cl.
CPC ............ *B81B 7/008* (2013.01); *B81B 3/0005* (2013.01); *B81B 7/0041* (2013.01);
(Continued)

(58) Field of Classification Search
CPC ............ B81B 7/0041; B81B 2207/012; B81B 2201/02; B81B 7/008; B81B 2203/0353;
(Continued)

(56) References Cited

U.S. PATENT DOCUMENTS 6,500,760 B1* 12/2002 Peterson ............... B81B 7/0006
                                                           438/684
7,235,281 B2* 6/2007 Rusu ................... B81C 1/00293
                                                           427/248.1
(Continued)

FOREIGN PATENT DOCUMENTS

CN       101447464 A      6/2009
CN       103011051 A      4/2013
(Continued)

OTHER PUBLICATIONS

OA dated Dec. 5, 2017 in co-pending application CN 201610724049.0.

(Continued)

*Primary Examiner* — Jesse Y Miyoshi
(74) *Attorney, Agent, or Firm* — WPAT, P.C., Intellectual Property Attorneys; Anthony King

(57) ABSTRACT

A semiconductor structure includes: a first device; a second device contacted with the first device, wherein a chamber is formed between the first device and the second device; a first hole disposed in the second device and defined between a first end with a first circumference and a second end with a second circumference; a second hole disposed in the second device and aligned to the first hole; and a sealing object for sealing the second hole. The first end links with the chamber, and the first circumference is different from the second circumference, the second hole is defined between the second end and a third end with a third circumference, and (Continued)

the second circumference and the third circumference are smaller than the first circumference.

20 Claims, 35 Drawing Sheets

(52) U.S. Cl.
CPC ...... *B81C 1/00277* (2013.01); *B81C 1/00293* (2013.01); *B81B 2201/02* (2013.01); *B81B 2207/012* (2013.01); *B81C 2203/019* (2013.01); *B81C 2203/0145* (2013.01); *B81C 2203/0172* (2013.01); *B81C 2203/0792* (2013.01); *H01L 2224/11* (2013.01)

(58) Field of Classification Search
CPC ... B81B 7/0035; B81B 7/0038; B81B 7/0074; B81B 7/0029; B81B 2201/025; B81B 2201/0235; B81B 2201/0228; B81B 2201/0292; B81B 2207/11; B81B 2207/115; B81B 2207/99; B81C 1/00293; B81C 2203/0145; B81C 2203/019
See application file for complete search history.

(56) References Cited

U.S. PATENT DOCUMENTS

| | | | | |
|---|---|---|---|---|
| 8,350,346 | B1* | 1/2013 | Huang | B81B 3/0051 257/414 |
| 8,987,059 | B2 | 3/2015 | Liang et al. | |
| 9,040,334 | B2 | 5/2015 | Chu et al. | |
| 9,065,358 | B2 | 6/2015 | Tsai et al. | |
| 9,085,455 | B2 | 7/2015 | Cheng et al. | |
| 9,085,456 | B2 | 7/2015 | Tsai et al. | |
| 9,122,827 | B2 | 9/2015 | Chen et al. | |
| 9,133,017 | B2 | 9/2015 | Liang et al. | |
| 9,138,994 | B2 | 9/2015 | Peng et al. | |
| 9,139,420 | B2 | 9/2015 | Chang et al. | |
| 9,139,423 | B2 | 9/2015 | Chien et al. | |
| 9,181,083 | B2 | 11/2015 | Tsai et al. | |
| 9,187,317 | B2* | 11/2015 | Cheng | B81C 1/00309 |
| 9,233,839 | B2 | 1/2016 | Liu et al. | |
| 9,236,877 | B2 | 1/2016 | Peng et al. | |
| 9,238,581 | B2 | 1/2016 | Wu et al. | |
| 2006/0246631 | A1* | 11/2006 | Lutz | B81B 3/0005 438/127 |
| 2010/0252898 | A1* | 10/2010 | Tanaka | B81B 7/0041 257/415 |
| 2013/0074596 | A1* | 3/2013 | Takizawa | B81B 7/0041 73/504.12 |
| 2014/0008738 | A1* | 1/2014 | Morris, III | B81B 7/02 257/415 |
| 2014/0070339 | A1* | 3/2014 | Marx | B81B 7/007 257/415 |
| 2014/0287548 | A1 | 9/2014 | Lin et al. | |
| 2014/0299966 | A1 | 10/2014 | Chahal et al. | |
| 2015/0028438 | A1 | 1/2015 | Kanamaru et al. | |
| 2015/0091153 | A1 | 4/2015 | Liu et al. | |
| 2015/0123217 | A1* | 5/2015 | Reinmuth | G01P 15/0802 257/415 |
| 2015/0137303 | A1 | 5/2015 | Chou et al. | |
| 2015/0175405 | A1 | 6/2015 | Cheng | |
| 2015/0175407 | A1 | 6/2015 | Cheng et al. | |
| 2015/0196912 | A1 | 7/2015 | Tsai et al. | |
| 2016/0272486 | A1* | 9/2016 | Shin | G01P 15/0802 |

FOREIGN PATENT DOCUMENTS

| | | |
|---|---|---|
| CN | 103011051 | 12/2016 |
| DE | 102014202801 A1 | 8/2015 |
| EP | 1834924 A2 | 9/2007 |
| EP | 1845061 | 10/2007 |
| EP | 1845061 A2 | 10/2007 |
| EP | 2014612 | 1/2009 |
| WO | 2007087021 | 8/2007 |
| WO | 2013145287 | 8/2015 |

OTHER PUBLICATIONS

English translation of relevant sections of OA dated Dec. 5, 2017 in co-pending application CN 201610724049.0.
CN103011051A is a family patent to US2013074596A1.
Office action and search report from the Korean patent office dated Jun. 19, 2017, for counterpart application No. 10-2016-0019731, which cites EP1845061 and WO2013145287.
US20150028438 corresponds to WO2013145287.
Notice of Allowance dated Dec. 18, 2017 from the Korea counterpart application No. 10-2016-0019731.
Office action dated Feb. 8, 2018 from the Taiwan counterpart application 105121085.

* cited by examiner

SEMICONDUCTOR STRUCTURE AND METHOD FOR FABRICATING THE SAME

CROSS REFERENCE TO RELATED APPLICATIONS

This application is a continuation of U.S. application Ser. No. 14/935,318, filed on Nov. 6, 2015, which is incorporated by reference in its entirety.

BACKGROUND

Micro-electro mechanical system (MEMS) devices have been developed and used in electronic equipment. In MEMS device fabrication, semiconductive materials are used to form mechanical and electrical features. A MEMS device may include a number of dements (e.g., stationary or movable elements) for achieving electro-mechanical functionality. MEMS applications include motion sensors, pressure sensors, printer nozzles, or the like. One or more chambers designed to operate at a desired pressure, such as sub-atmospheric pressure or vacuum pressure, may be formed within a MEMS device. To ensure a desired pressure in a chamber within a MEMS device, the surface of the chamber should be hermetically sealed so as to secure the performance, reliability, and lifespan of the MEMS device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
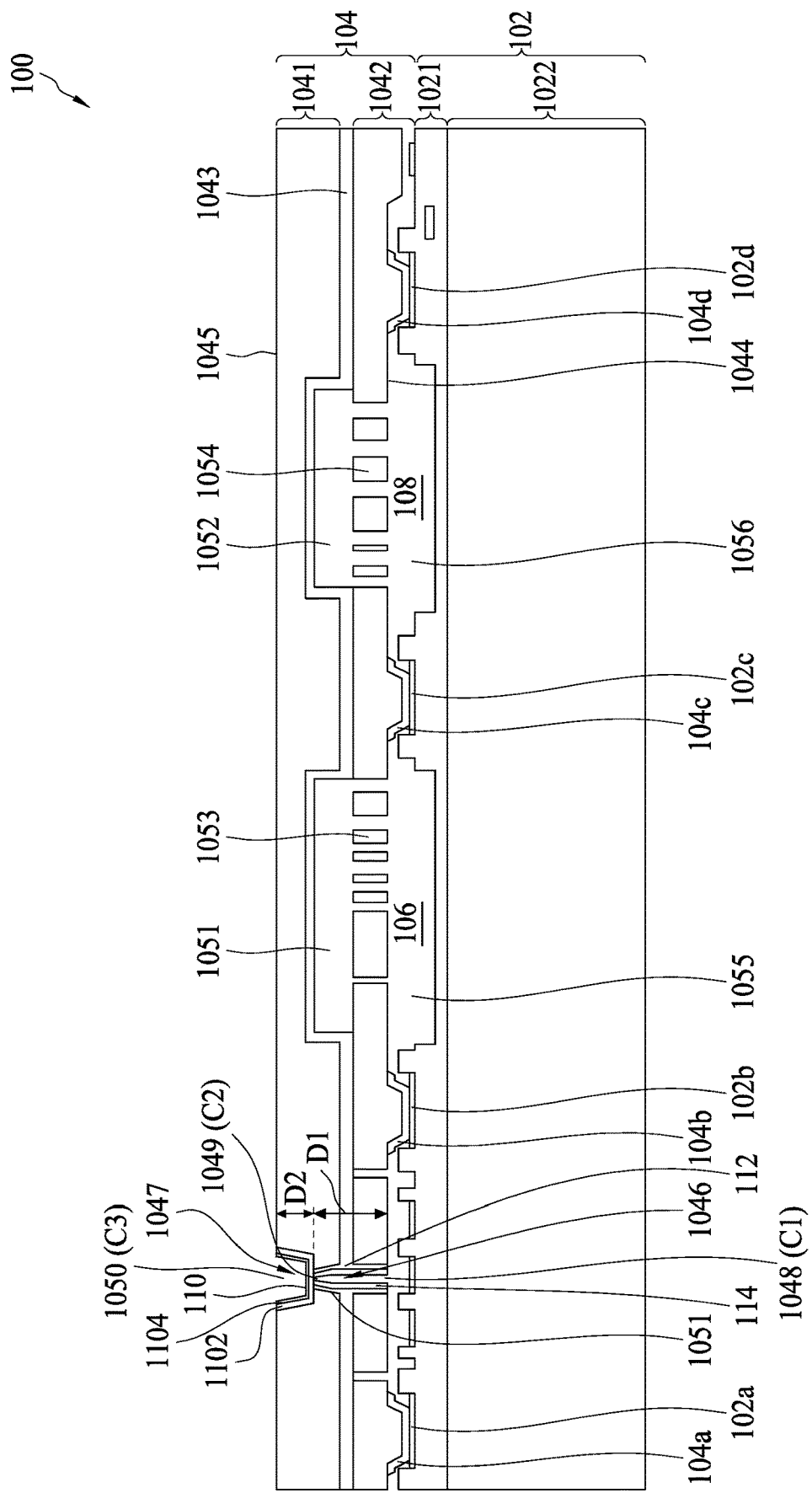
FIG. 1A is a cross-sectional view of a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

In the present disclosure, a semiconductor structure is discussed. The semiconductor structure may include a chamber formed therein. The semiconductor structure may be a partial semiconductor configuration of a motion sensor, a pressure sensor, or any other MEMS applications. FIG. 1A is a cross-sectional view of a semiconductor structure 100 in accordance with some embodiments. The semiconductor structure 100 may be an integrated device. In an embodiment, the semiconductor structure 100 comprises two devices bonded to each other. The first device may be a complementary metal oxide semiconductor (CMOS) device 102, and the second device may be a micro-electro mechanical system (MEMS) device 104. However, this is not a limitation of the present disclosure. It is understood that the present disclosure refers generally to a wafer level structure. The devices described herein may take various forms including, but not limited to, wafers (or portions thereof) having integrated circuits formed by CMOS-based processes, dies, MEMS substrates, capping substrates, and a single substrate with CMOS devices and MEMS devices formed thereon. A wafer may not include an integrated circuit. Furthermore, specific embodiments may be described herein which are exemplary only and not intended to be limiting. Additionally, although described as providing for coupling two wafer-level devices, any number of wafer-level devices may be coupled according to aspects of the present disclosure. Further, though the present disclosure refers to MEMS devices, persons having ordinary skill in the art will find other applicable technologies that may benefit from the disclosure including, but not limited to, nanoelectromechanical systems (NEMS) devices.

The MEMS device 104 is disposed opposite and contacted to the CMOS device 102. A first chamber 106 and a second chamber 108 are formed between the MEMS device 104 and the CMOS device 102. The first chamber 106 and the second chamber 108 are two separate chambers. The first chamber 106 may have one atmospheric pressure. The second chamber 108 may be a vacuum pressure. However, this is not a limitation of the present disclosure. The first chamber 106 and the second chamber 108 may have any types of pressure.

The MEMS device 104 includes a cap wafer 1041 and a MEMS wafer 1042. The cap wafer 1041 is disposed over the MEMS wafer 1042. An oxide layer 1043 is disposed between the cap wafer 1041 and the MEMS wafer 1042. The MEMS wafer 1042 has an inner surface 1044 facing the CMOS device 102. The cap wafer 1041 has an outer surface 1045 exposed to an ambient environment. A plurality of bonding metals 104a~104d are disposed on the inner surface 1044 of the MEMS wafer 1042. The plurality of bonding metals 104a~104d are used to connect the CMOS device 102.

Figure 1B:
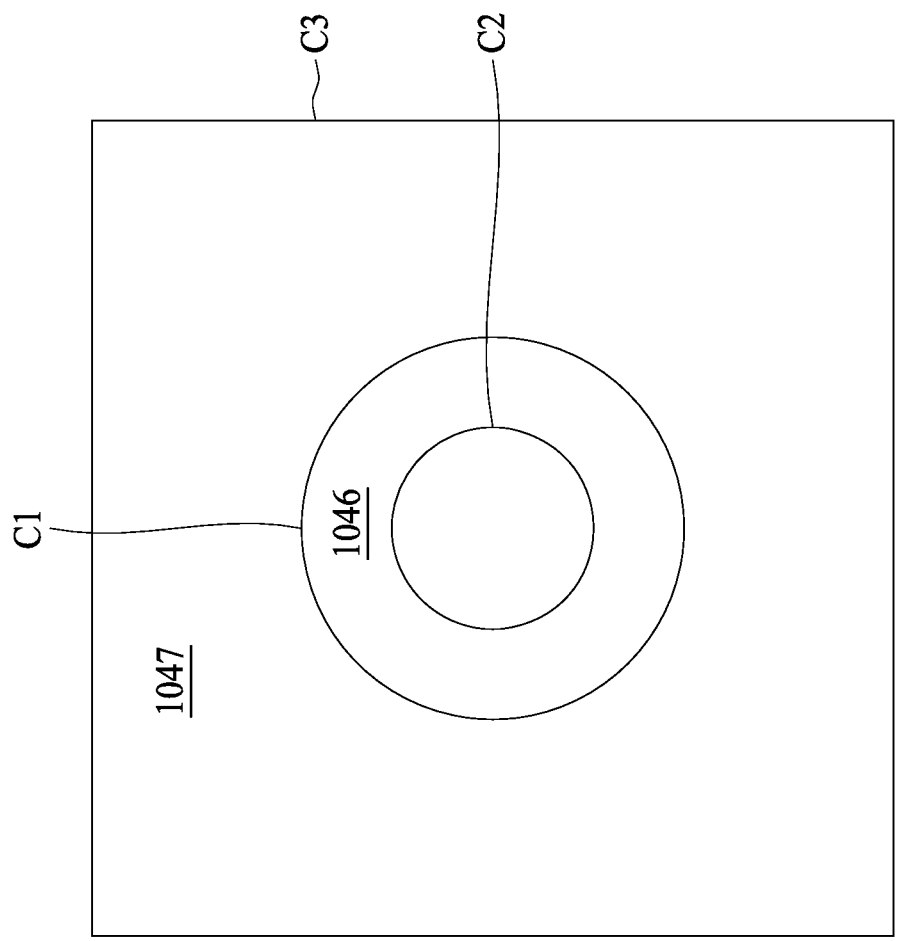
FIG. 1B is a top view of a first hole and a second hole in accordance with some embodiments.

The MEMS device 104 further comprises a first hole 1046 and a second hole 1047. FIG. 1B is a top view of the first hole 1046 and the second hole 1047 in accordance with some embodiments. A portion of the first hole 1046 is disposed in the MEMS wafer 1042 and the rest of the first hole 1046 is disposed in the cap wafer 1041. The second hole 1047 is disposed in the cap wafer 1041. The first hole 1046 is defined between a first end 1048 with a first circumference C1 and a second end 1049 with a second circumference C2. The first end 1048 links with the first chamber 106. The second hole 1047 is aligned to the first hole 1046, and the second hole 1047 is physically linked to the first hole 1046 at the second end 10449 of the first hole 1046 with the existence of the sealing object 110. The second hole 1047 is defined between the second end 1049 and a third end 1050 with a third circumference C3. The third end 1050 is open on the outer surface 1045 of the cap wafer 1041. The first circumference C1 is different from the second circumference C2. Specifically, the second circumference C2 is smaller than the first circumference C1, and the third circumference C3 is larger than the first circumference C1 and the second circumference C2. It is noted that the term "hole" may be an empty hole, a filled hole, a sealed hole, or a venthole.

The semiconductor structure 100 further comprises a sealing object 110 for sealing the second hole 1047. Specifically, the sealing object 110 comprises an oxide layer 1102 and a metal layer 1104. The oxide layer 1102 is disposed over the second hole 1047 in order to seal the second end 1049 linking the first hole 1046 and the second hole 1047. The metal layer 1104 is disposed over the oxide layer 1102.

The semiconductor structure 100 further comprises an oxide layer 112 and a polysilicon layer 114. The oxide layer 112 is disposed over the inner surface 1051 of the first hole 1046. The polysilicon layer 114 is disposed over the oxide layer 112.

In addition, the CMOS device 102 comprises a substrate 1021 and a multi-layer structure 1022. The substrate 1021 may include an application specific integrated circuit (ASIC). The ASIC may include a CMOS logic circuit arranged to process electronic signal from the first and second chambers 106 and 108. The multi-layer structure 1022 includes a stacked structure defined by a plurality of metal layers insulated by a plurality of dielectric layers, i.e. the interlayer dielectric. Metal lines are formed in the plurality of metal layers. Moreover, other components, such as conductive vias and/or contacts, may be formed in the plurality of dielectric layers in order to electrically connect the metal lines in different metal layers. The CMOS device 102 further comprises a plurality of bonding metals 102a~102d. The plurality of bonding metals 102a~102d is disposed on the multi-layer structure 1022. The plurality of bonding metals 102a~102d is connected to the plurality of bonding metals 104a~104d such that the electronic signal from the first chamber 106 and the second chamber 108 can be transmitted to the CMOS device 102. The bonding between the plurality of bonding metals 102a~102d and the plurality of bonding metals 104a~104d may be carried out by a eutectic bonding technique. The bonding metals 102a~102d, 104a~104d may be implemented by aluminum-copper (AlCu), germanium (Ge), platinum (Pt), aurum (Au), stannum (Sn), or copper (Cu).

In the semiconductor structure 100, the cap wafer 1041 further comprises a first cavity 1051 and a second cavity 1052. The MEMS wafer 1042 further comprises a first spring structure 1053 and a second spring structure 1054. The multi-layer structure 1022 further comprises a first recess 1055 and a second recess 1056. The first spring structure 1053 is positioned in the first chamber 106 defined by the first cavity 1051 and the first recess 1055. The second spring structure 1054 is positioned in the second chamber 108 defined by the second cavity 1052 and the second recess 1056.

In an embodiment, the first chamber 106 has one atmospheric pressure and the second chamber 108 has a vacuum pressure. The surface of the first chamber 106 is deposited by a self-assembled monolayer (SAM) coating in order to reduce adhesion in microstructures, e.g. the first spring structure 1053. Specifically, after the deposition of a SAM coating upon the surface of the first chamber 106, the surface becomes hydrophobic. Then, the capillary attraction that collapses the first spring structure 1053 is largely reduced. The deposition of a SAM coating upon the surface of the first chamber 106 is performed via the first hole 1046 and the second hole 1047 before the second end 1049 associated with the first hole 1046 is sealed. In other words, after the deposition of a SAM coating, the second end 1049 associated with the first hole 1046 is sealed by the sealing object. It is noted that the first chamber 106 links with the first hole 1046 so that the deposition of a SAM coating upon the surface of the first chamber 106 can be performed via the first hole 1046 and the second hole 1047.

The first hole 1046 is a tapered profile with a depth of D1. As shown in FIG. 1A and FIG. 1B, the first circumference C1 of the opening of the first end 1048 is larger than the second circumference C2 of the opening of the second end 1049. The second hole 1047 is a relatively large recess with a depth of D2 from the outer surface 1045 of the cap wafer 1041. As the second end 1049 associated with the first hole 1046 is exposed to the bottom of the recess (i.e. the second hole 1047) before the sealing object 110 is disposed on the second hole 1047, the depth of the first hole 1046 can be shortened to D1 rather D1+D2. D1 is about 130 um~160 um, while D2 is about 20 um~30 um. The width W of the first hole 1046 at the first end 1048 is about 3 um~5 um. Moreover, the second circumference C2 of the opening of the second end 1049 is much smaller than the third circumference C3 of the opening of the second hole 1047 on the outer surface 1045 and is also smaller than the first circumference C1 of the opening of the first end 1048. Accordingly, when the sealing object 110 is disposed on the second hole 1047, the opening of the second end 1049 is much easier to be sealed by the sealing object 110. Specifically, according to the present disclosure, the sealing object 110 is deposited on the bottom of the second hole 1047 in order to seal the opening of the second end 1049 of the first hole 1046. The sealing object 110 is not arranged to seal the bottom opening (i.e. the first end 1048) of the first hole 1046. Therefore, the sealing object 110 can hermetically seal the first chamber 106. For example, after the deposition of a SAM coating upon the surface of the first chamber 106, a sub-atmospheric chemical vapor deposition (SACVD) process can be performed to dispose the oxide layer 1102 over the second hole 1047 in order to seal the second end 1049 linking the first hole 1046 and the second hole 1047. Then, a deposition process can be performed to dispose the metal layer 1104 over the oxide layer 1102. The material of the metal layer 1104 may be aluminum (AL).

Figure 2:
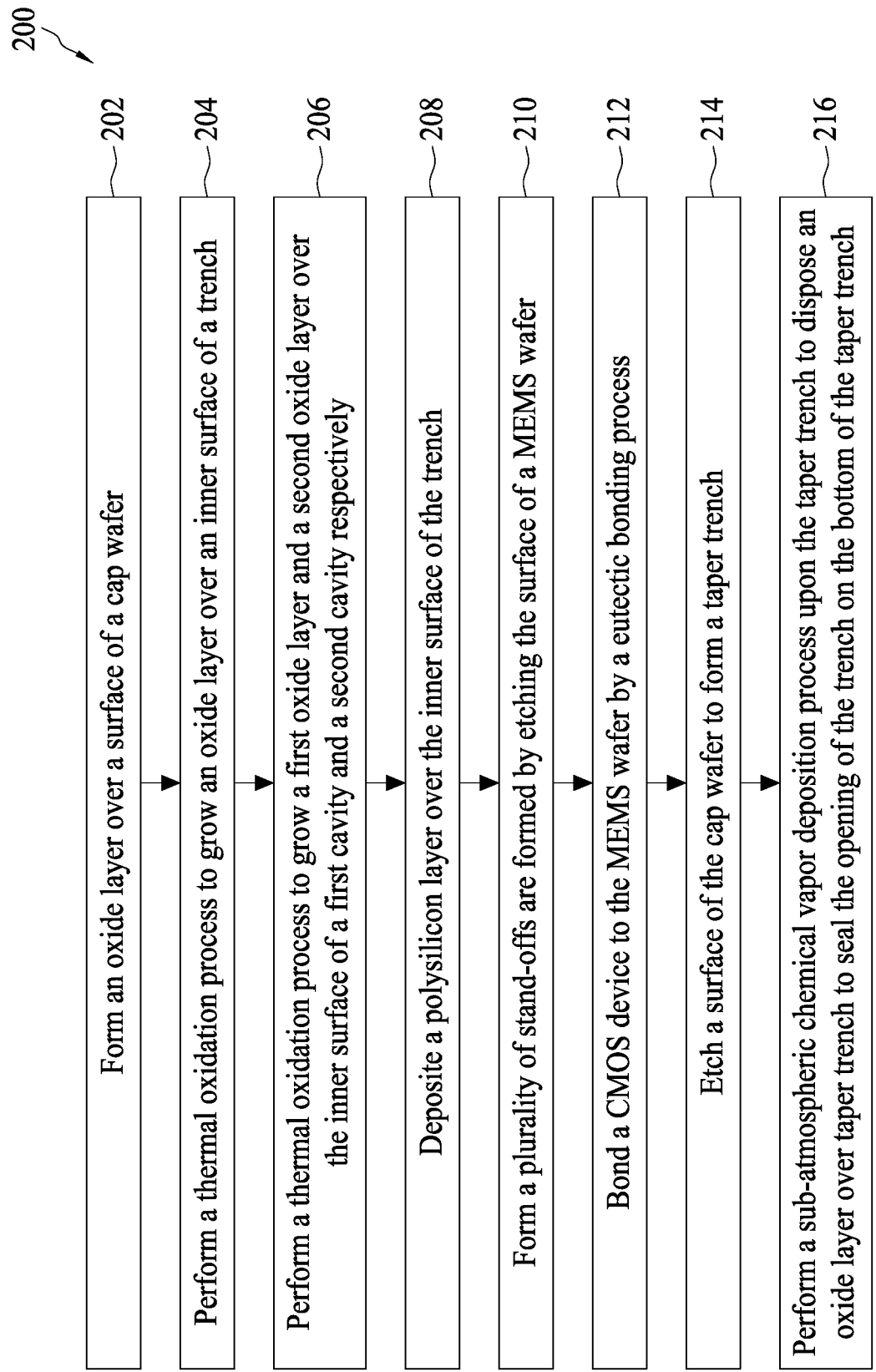
FIG. 2 is a flow diagram illustrating a method of fabricating a semiconductor structure in accordance with some embodiments.
Figure 3:
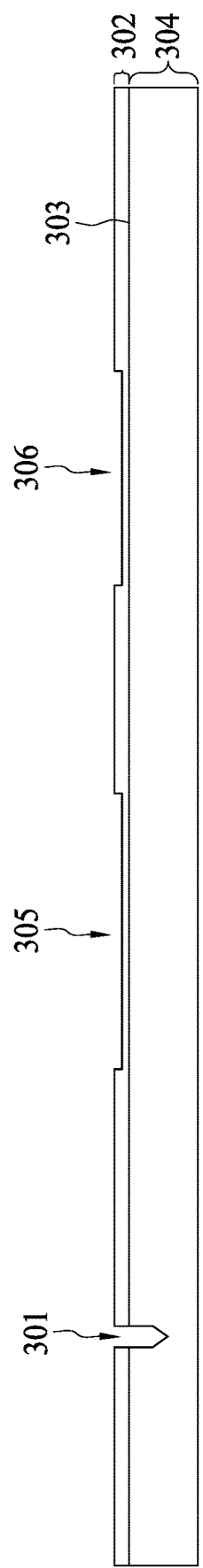
FIG. 3 is a cross-sectional view of a cap wafer with a trench formed during a fabricating process in accordance with some embodiments.
Figure 4:
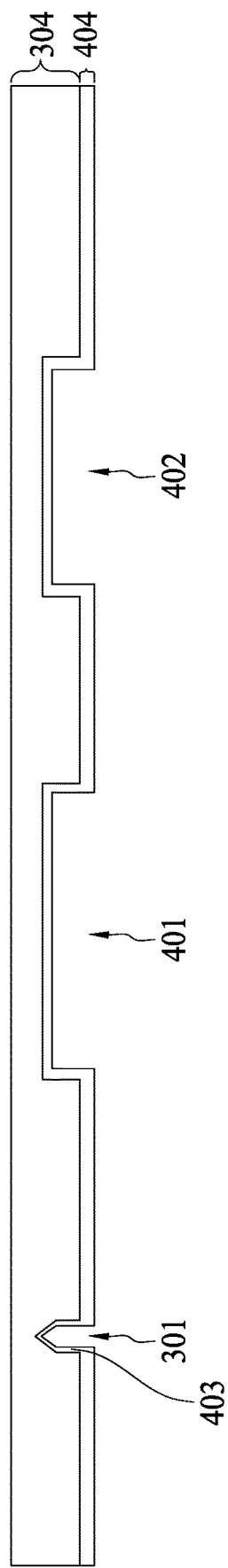
FIG. 4 is a cross-sectional view of a cap wafer with a first cavity and a second cavity formed during a fabricating process in accordance with some embodiments.
Figure 5:
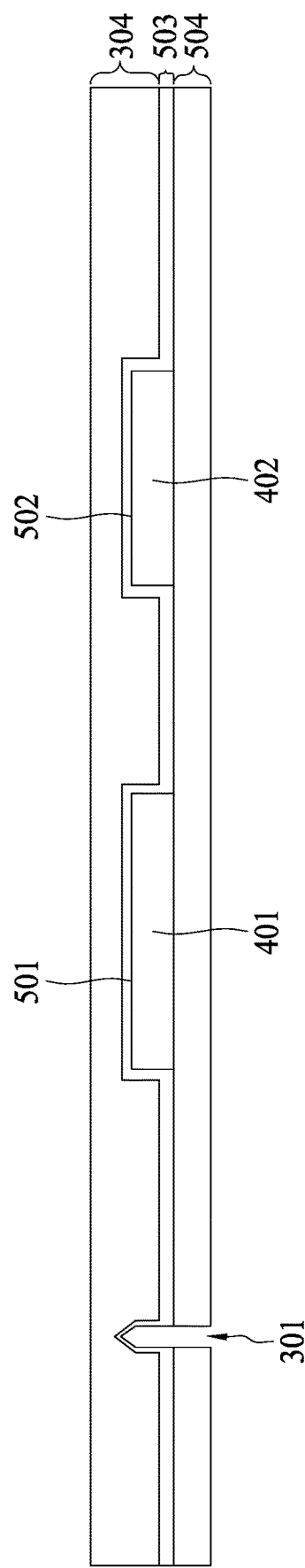
FIG. 5 is a cross-sectional view of a cap wafer and a MEMS wafer formed during a fabricating process in accordance with some embodiments.
Figure 6:
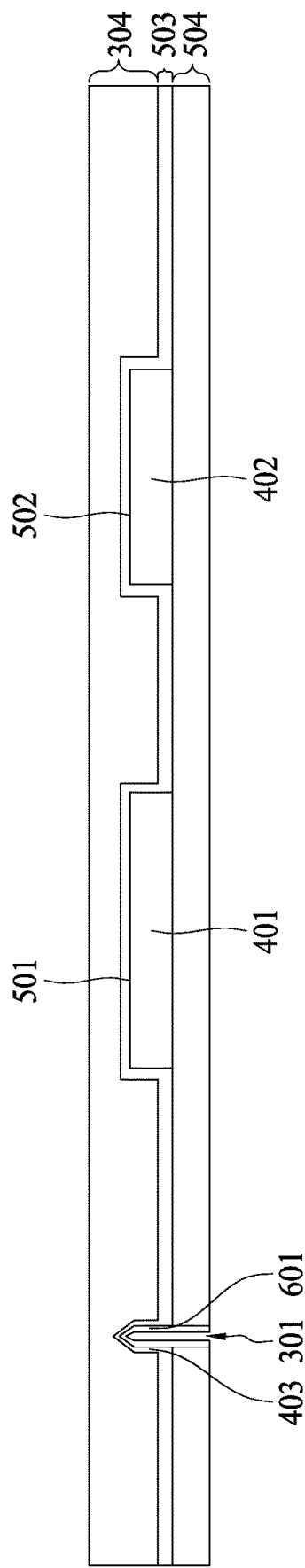
FIG. 6 is a cross-sectional view of a MEMS device with a poly film formed during a fabricating process in accordance with some embodiments.
Figure 7:
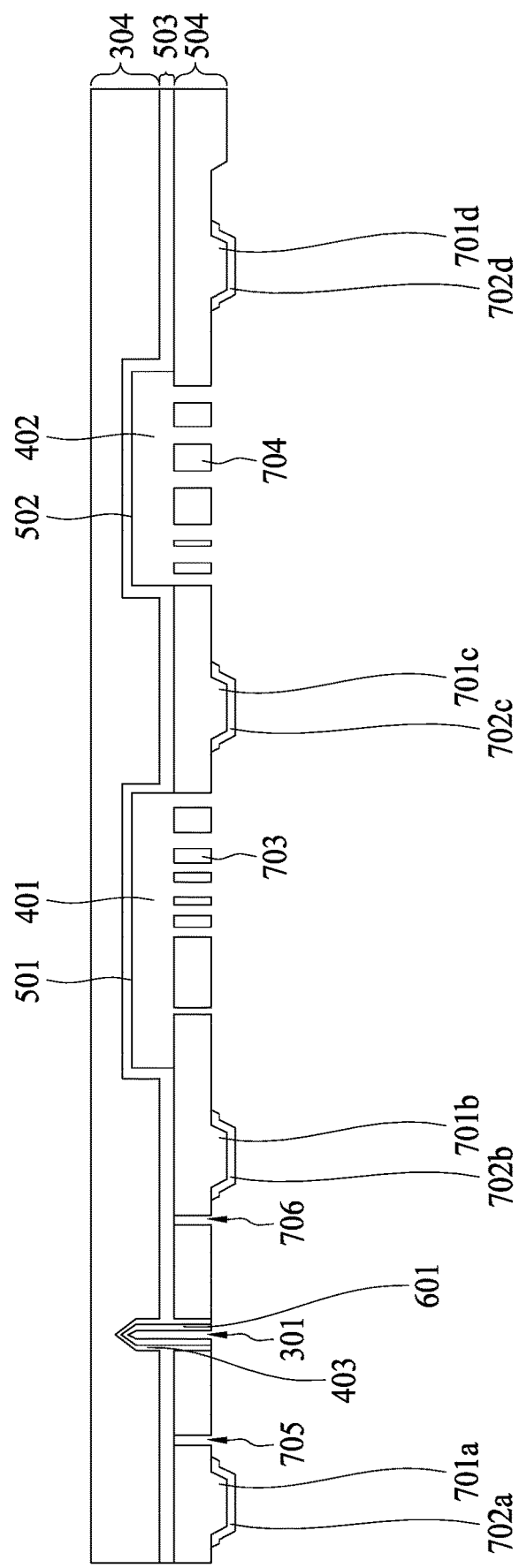
FIG. 7 is a cross-sectional view of a MEMS device with a plurality of bonding metals, a first spring structure, and a second spring structure formed during a fabricating process in accordance with some embodiments.
Figure 8:
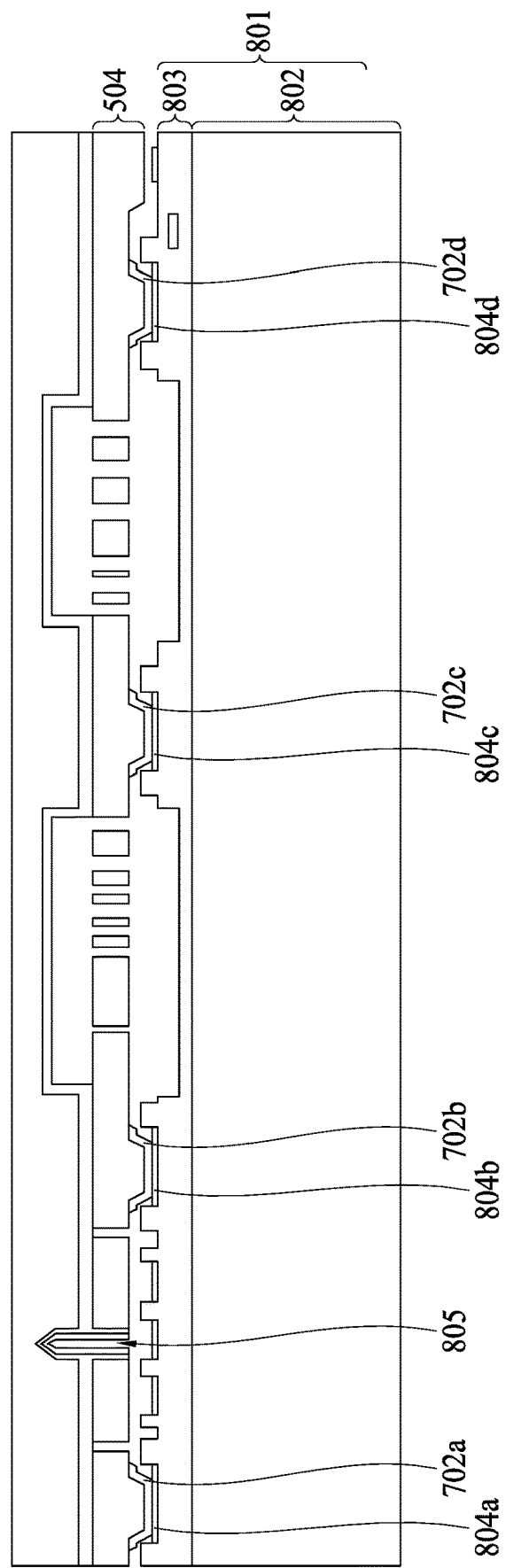
FIG. 8 is a cross-sectional view of a MEMS device and a CMOS device formed during a fabricating process in accordance with some embodiments.
Figure 9:
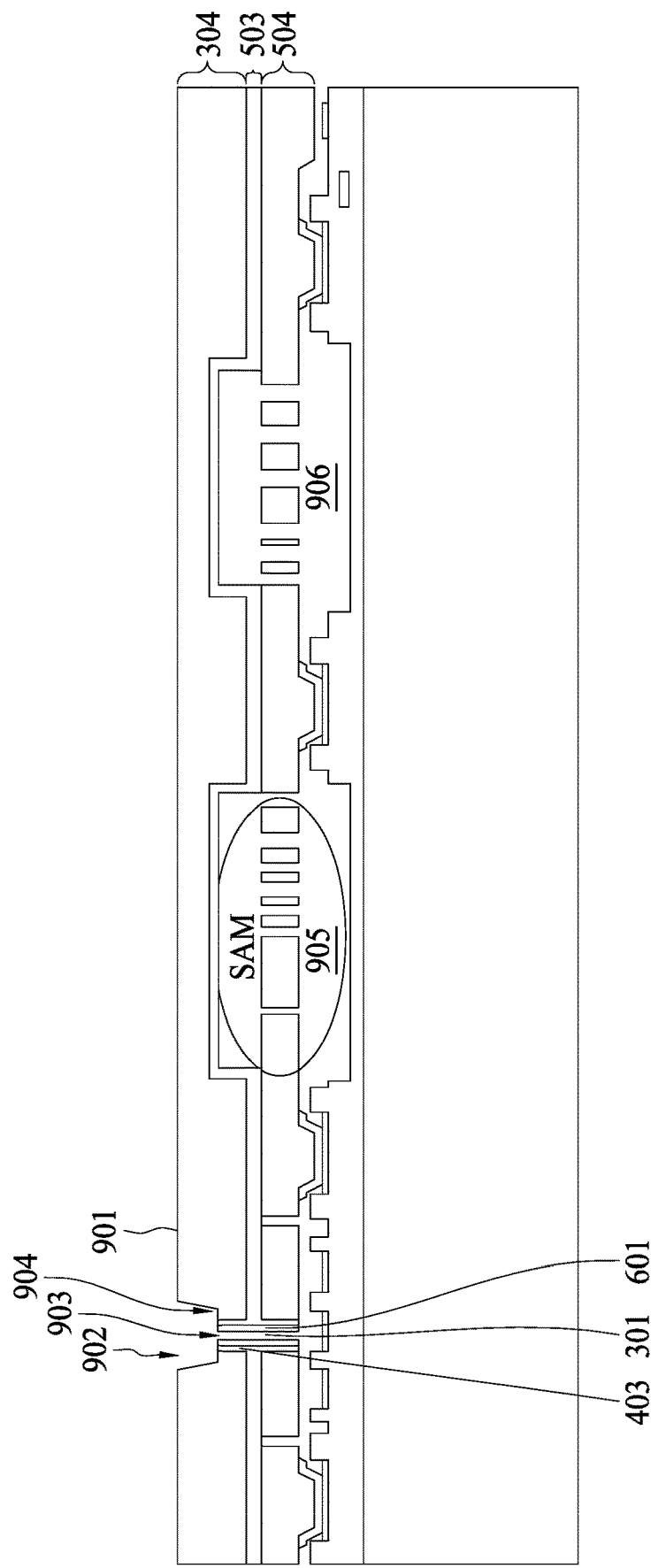
FIG. 9 is a cross-sectional view of a semiconductor structure with an opening formed during a fabricating process in accordance with some embodiments.
Figure 10:
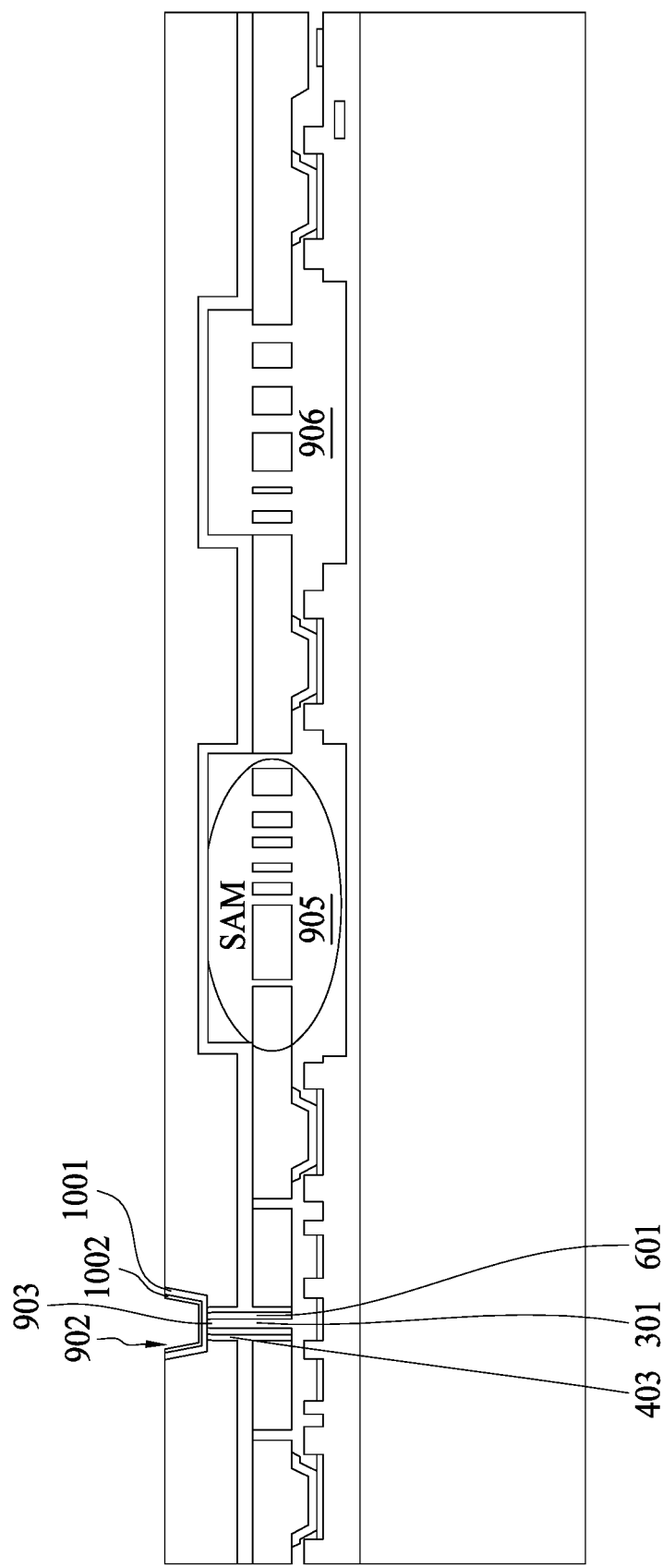
FIG. 10 is a cross-sectional view of a semiconductor structure formed during a fabricating process in accordance with some embodiments.

FIG. 2 is a flow diagram illustrating a method 200 of fabricating the semiconductor structure 100 in accordance with some embodiments. FIGS. 3~10 are diagrams illustrating stages in the fabrication of the semiconductor structure 100 in accordance with some embodiments. Specifically, FIG. 3 is a cross-sectional view of the cap wafer 304 with a trench 301 formed during a fabricating process in accordance with some embodiments. FIG. 4 is a cross-sectional view of the cap wafer 304 with a first cavity 401 and a second cavity 402 formed during the fabricating process in accordance with some embodiments. FIG. 5 is a cross-sectional view of the cap wafer 304 and the MEMS wafer 504 formed during the fabricating process in accordance with some embodiments. FIG. 6 is a cross-sectional view of a MEMS device with a poly film 601 formed during the fabricating process in accordance with some embodiments. FIG. 7 is a cross-sectional view of the MEMS device with the plurality of bonding metals 702a~702d, the first spring structure 703, and the second spring structure 704 formed during the fabricating process in accordance with some embodiments. FIG. 8 is a cross-sectional view of the MEMS device and a CMOS device formed during the fabricating process in accordance with some embodiments. FIG. 9 is a cross-sectional view of a semiconductor structure with an opening formed during the fabricating process in accordance with some embodiments. FIG. 10 is a cross-sectional view of the semiconductor structure formed during the fabricating process in accordance with some embodiments. The method is a simplified semiconductor process. Therefore, other steps or operations may be incorporated in the process.

Referring to FIG. 3, in operation 202, an oxide layer 302 is formed over the surface 303 of a cap wafer 304. The oxide layer 302 is etched to have a first recess 305 and a second recess 306 on the positions corresponding to a first chamber (e.g. 106) and a second chamber (e.g. 108), respectively. The oxide layer 302 may be a TEOS oxide layer. The TEOS oxide may be implemented by Tetraethyl Orthosilicate, Si(OC2H5)4. The oxide layer 302 may be deposited on the surface 303 of the cap wafer 304 by a chemical vapor deposition (CVD) technique. Then, the oxide layer 302 and the cap wafer 304 are etched to form the trench 301. The trench 301 does not penetrate the cap wafer 304. The depth of the trench 301 is about 130 um.

Referring to FIG. 4, in operation 204, a thermal oxidation process is performed upon the structure obtained in operation 202 in order to grow an oxide layer 403 over the inner surface of the trench 301. After the thermal oxidation process, the thickness of the oxide layer 302, which is labeled as 404 in FIG. 4, may increase. Then, the oxide layer 404 and the cap wafer 304 corresponding to the first recess 305 and the second recess 306 are etched to form the first cavity 401 and the second cavity 402, respectively. The first cavity 401 and the second cavity 402 define the first chamber and the second chamber, respectively. The first cavity 401 and the second cavity 402 are more shallow than the trench 301.

Referring to FIG. 5, in operation 206, a thermal oxidation process is performed upon the structure obtained in operation 204 in order to grow a first oxide layer 501 and a second oxide layer 502 over the inner surface of the first cavity 401 and the second cavity 402, respectively. After the thermal oxidation process, the thickness of the oxide layer 404, which is labeled as 503 in FIG. 5, may increase. Then, a MEMS wafer 504 is bonded to the oxide layer 503 by a fusion bonding process. After the fusion bonding process, a portion of the MEMS wafer 504 corresponding to the position of the trench 301 is etched for exposing the trench 301 so that the first hole 1046 can be subsequently defined.

Referring to FIG. 6, in operation 208, a polysilicon layer 601 is deposited over the inner surface (i.e. the oxide layer 403) of the trench 301. The polysilicon layer 601 may be an epitaxial silicon layer formed by a vapor-phase epitaxy (VPE) process, which is a modification of chemical vapor deposition.

Referring to FIG. 7, in operation 210, a plurality of stand-offs 701a~701d are formed by etching the surface of the MEMS wafer 504. The plurality of stand-offs 701a~701d is disposed by a plurality of bonding metals 702a~702d, respectively. The material of the bonding metals 702a"~702d may be aluminum-copper (AlCu), germanium (Ge), platinum (Pt), aurum (Au), stannum (Sn), or copper (Cu). After the bonding metals 702a~702d are patterned over the stand-offs 701a~701d, a deep reactive-ion etching (IMF) is performed upon the MEMS wafer 504 to form a first spring structure 703 and a second spring structure 704 under the first cavity 401 and the second cavity 402, respectively. It is noted that some steep-sided holes or trenches, e.g. 705 and 706, may also be formed in the MEMS wafer 504 depending on the requirement.

Referring to FIG. 8, in operation 212, a CMOS device 801 is provided. The CMOS device 801 is bonded to the MEMS wafer 504 by a eutectic bonding process. The CMOS device 801 comprises a substrate 802 and a multi-layer structure 803. The multi-layer structure 803 comprises a plurality of bonding metals 804a~804d. The plurality of bonding metals 804a~804d is eutectically bonded with the plurality of bonding metals 702a~702d of the MEMS wafer 504, respectively. An end 805 of the trench 301 faces to the CMOS device 801.

Referring to FIG. 9, in operation 214, the surface 901 of the cap wafer 304 is etched to form a tapered trench 902. The position of the tapered trench 902 is substantially above the trench 301. The pointed end of the trench 301 is open (i.e. the opening 903) to the bottom 904 of the tapered trench 902. It is noted that the poly film 601 disposed over the inner surface of the trench 301 serves as an etch stop for the trench 301 when the pointed end of the trench 301 is opened to the bottom 904 of the tapered trench 902. As a result, the circumference of the opening 903 of the trench 301 on the bottom 904 of the tapered trench 902 can be relatively small. Then, a SAM coating is performed upon a first chamber 905 via the opening 903 of the trench 301 on the bottom 904 of the tapered trench 902. It is noted that a second chamber 906 with a vacuum pressure is formed in the right side of the first chamber 905.

Referring to FIG. 10, in operation 216, a sub-atmospheric chemical vapor deposition (SACVD) process is performed upon the tapered trench 902 to dispose an oxide layer 1001 over tapered trench 902 in order to seal the opening 903 of the trench 301 on the bottom 904 of the tapered trench 902. Then, a deposition process is performed upon the oxide layer 1001 to dispose a metal layer 1002 over the oxide layer 1001. The material of the metal layer 1002 may be aluminum (AL). Then, the opening 903 of the trench 301 is hermetically sealed by the oxide layer 1001 and the metal layer 1002.

According to operations 202~216, the semiconductor structure 100 having the first chamber 106 with one atmospheric pressure and the second chamber 108 with a vacuum pressure is fabricated, in which the hole (i.e. 1046) of the first chamber 106 is hermetically sealed.

Figure 11:
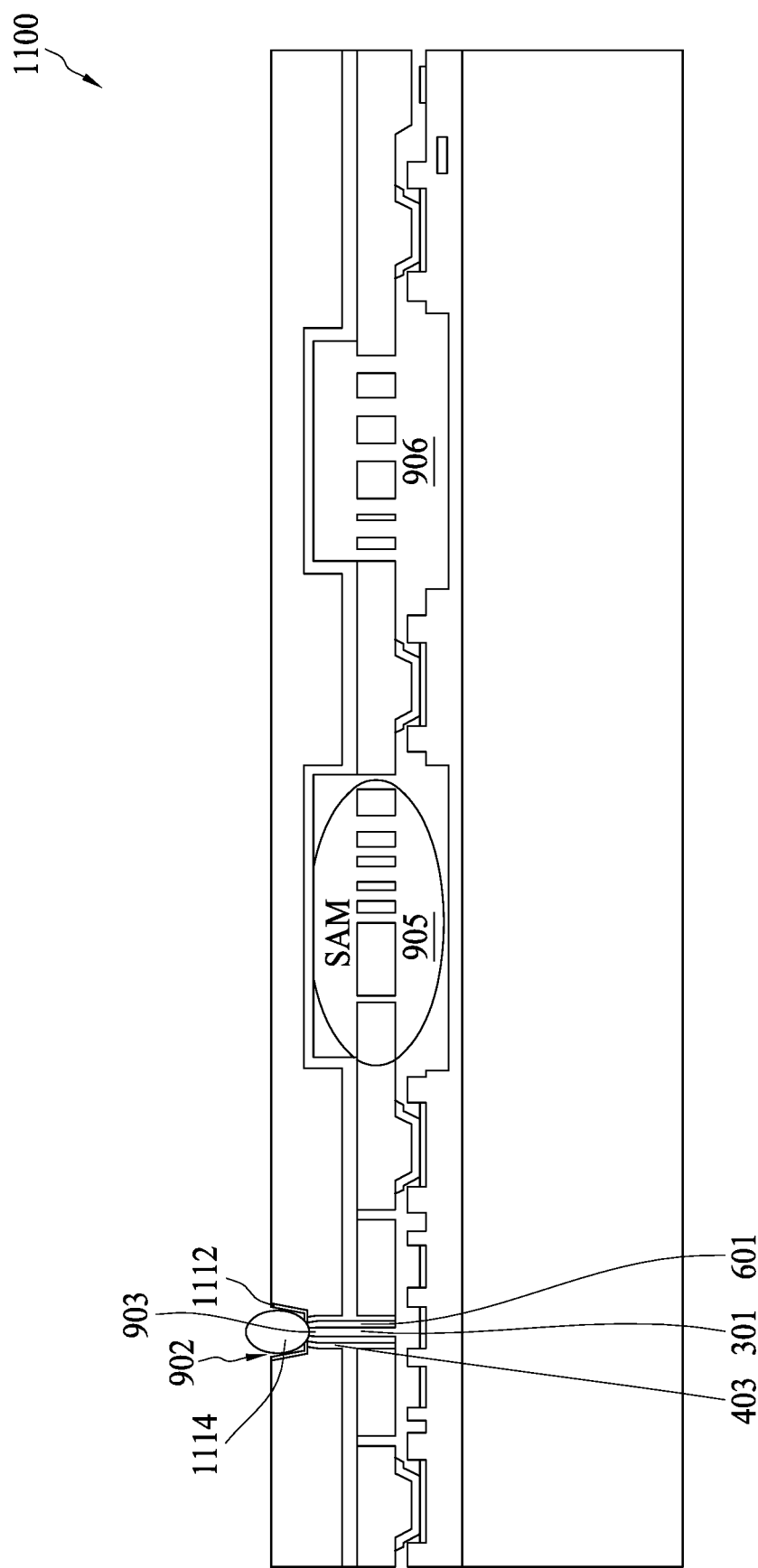
FIG. 11 is a cross-sectional view of a semiconductor structure formed during a fabricating process in accordance with some embodiments.

Instead of sealing the opening 903 of the trench 301 by the oxide layer 1001 and the metal layer 1002 in operation 216, the opening 903 can also be sealed by a metal layer and a solder ball, as shown in FIG. 11. FIG. 11 is a cross-sectional view of the semiconductor structure 1100 formed during the fabricating process in accordance with some embodiments.

Referring to FIG. 11, after the SAM coating is performed upon the first chamber 905 via the opening 903 of the trench 301 on the bottom 904 of the tapered trench 902, a metal sputtering process is performed upon the tapered trench 902 to dispose a metal layer 1112 over the tapered trench 902 in order to seal the opening 903 of the trench 301 on the bottom 904 of the tapered trench 902. Then, a solder ball 1114 is disposed over the metal layer 1112 to further seal the opening 903 of the trench 301. After the solder ball 1114 is disposed over the metal layer 1112, the semiconductor structure 1100 may not be processed by a high temperature environment. Therefore, in this embodiment, the electrical signals in the semiconductor structure 1100 are transmitted to an external circuit by bonding wires as the bonding wires can be bonded to the semiconductor structure 1100 under a low temperature environment. In addition, the material of the metal layer 1112 may be aluminum (AL) and the material of the solder ball 1114 may be stannum (Sn). Accordingly, in the embodiment of FIG. 11, the opening 903 of the trench 301 is hermetically sealed by the metal layer 1112 and the solder ball 1114.

Figure 12:
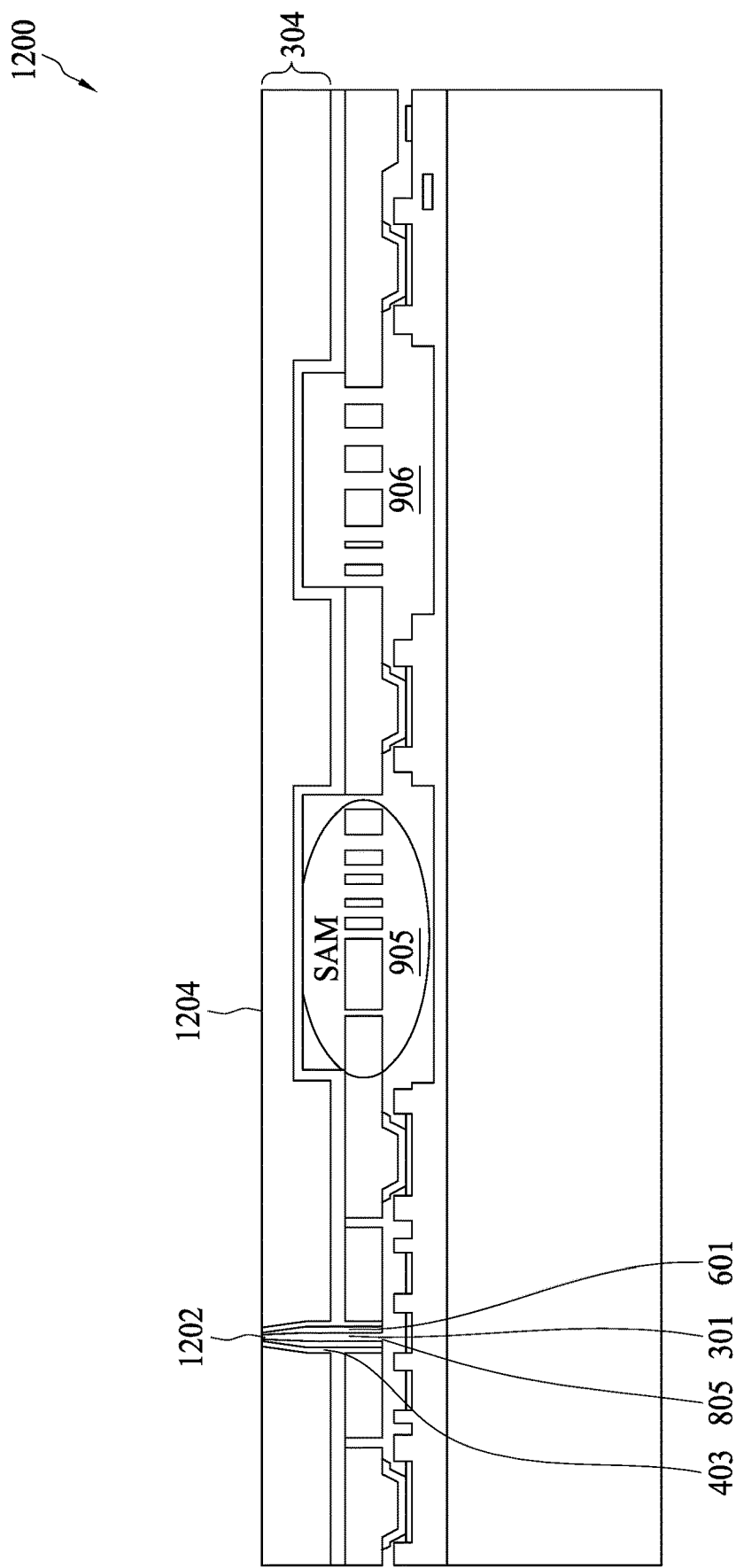
FIG. 12 is a cross-sectional view of the semiconductor structure with an opening formed during a fabricating process in accordance with some embodiments.

Moreover, as shown in FIG. 8, after the CMOS device 801 is bonded to the MEMS wafer 504 by the eutectic bonding process, the surface 901 of the cap wafer 304 may also be grinded and blanket etched until the pointed end of the trench 301 is exposed as shown in FIG. 12. FIG. 12 is a cross-sectional view of the semiconductor structure 1200 with an opening formed during the fabricating process in accordance with some embodiments. Specifically, when the CMOS device 801 is bonded to the MEMS wafer 504 as shown in FIG. 8, a silicon grinding process is first performed upon the surface 901 of the cap wafer 304. When the pointed end of the trench 301 is about to be exposed, a blanket etching process is then performed upon the grinded surface of the cap wafer 304 until the pointed end of the trench 301 is exposed. When the pointed end of the trench 301 is exposed (i.e. the opening 1202), the SAM coating is performed upon a first chamber 905 via the opening 1202 of the trench 301. The circumference of the opening 1202 is about C2 while the circumference of the other end 805 facing the first chamber 905 is about C1 as shown in FIG. 1B. Accordingly, the trench 301 becomes a hole passing through the MEMS device formed by the cap wafer 304, the oxide layer 503, and MEMS wafer 504.

Figure 13:
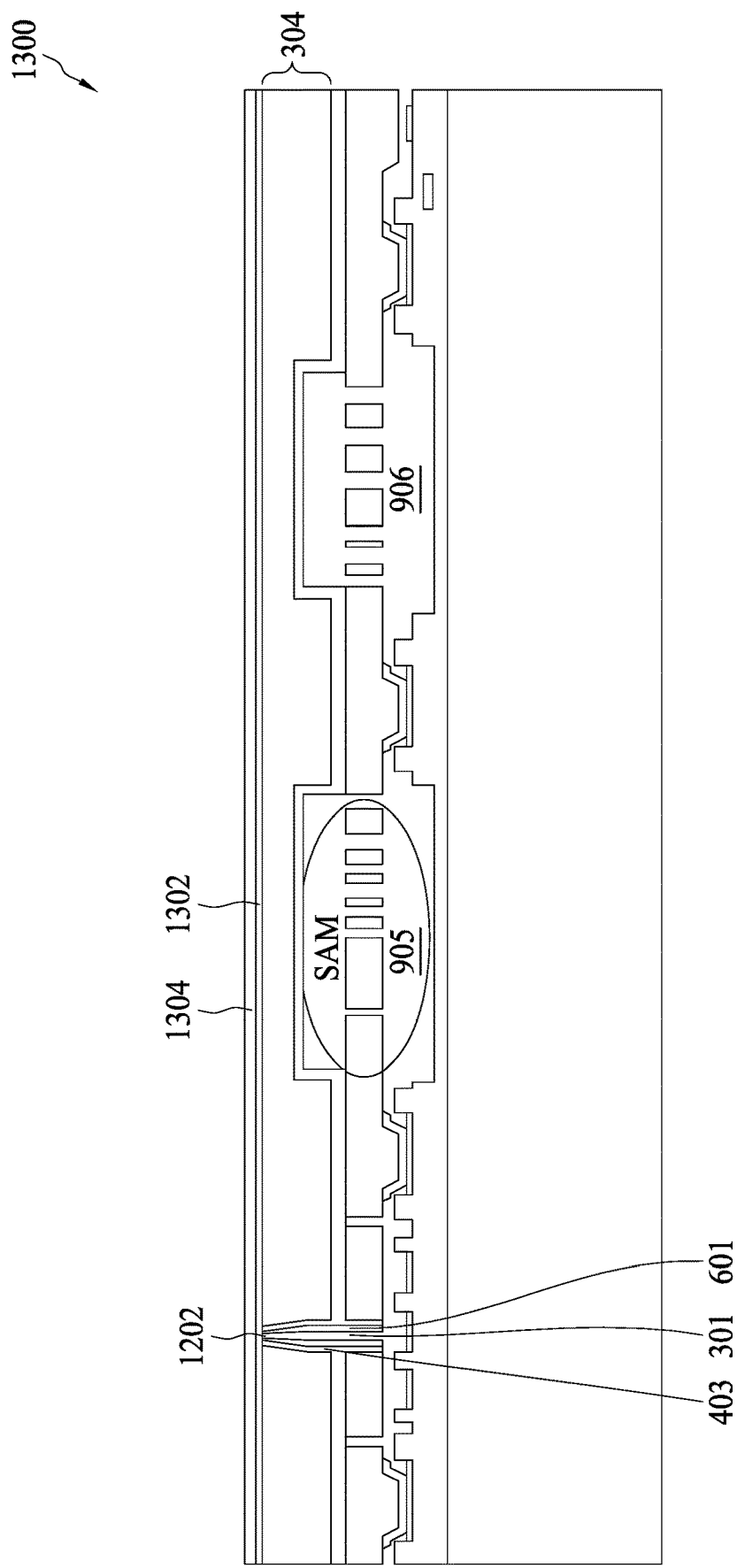
FIG. 13 is a cross-sectional view of a semiconductor structure formed during a fabricating process in accordance with some embodiments.

Referring to FIG. 13, which is a cross-sectional view of the semiconductor structure 1300 formed during the fabricating process in accordance with some embodiments, after the SAM coating is performed upon the first chamber 905 via the opening 1202 of the trench 301 on the surface 1204 of the cap wafer 304, a sealing process is performed upon the surface 1204 of the cap wafer 304 to dispose a polymer layer 1302 for sealing the opening 1202 of the trench 301. Then, a metal layer 1304 is disposed over the polymer to further seal the opening 1202 of the trench 301. The material of the metal layer 1304 may be aluminum (AL). Accordingly, in the embodiment of FIG. 13, the opening 1202 of the trench 301 is hermetically sealed by the polymer layer 1302 and the metal layer 1304.

It is noted that, for the embodiments of FIG. 12 and FIG. 13, the poly film 601 disposed over the inner surface of the trench 301 is optional. Specifically, the poly film 601 serves as an etch stop for the trench 301 in operation 214. However, the silicon grinding process and the blanket etching process are arranged to directly grind the surface 901 of the cap wafer 304 until the pointed end of the trench 301 is exposed. Therefore, the poly film 601 may be omitted in the silicon grinding process and the blanket etching process.

Figure 14A:
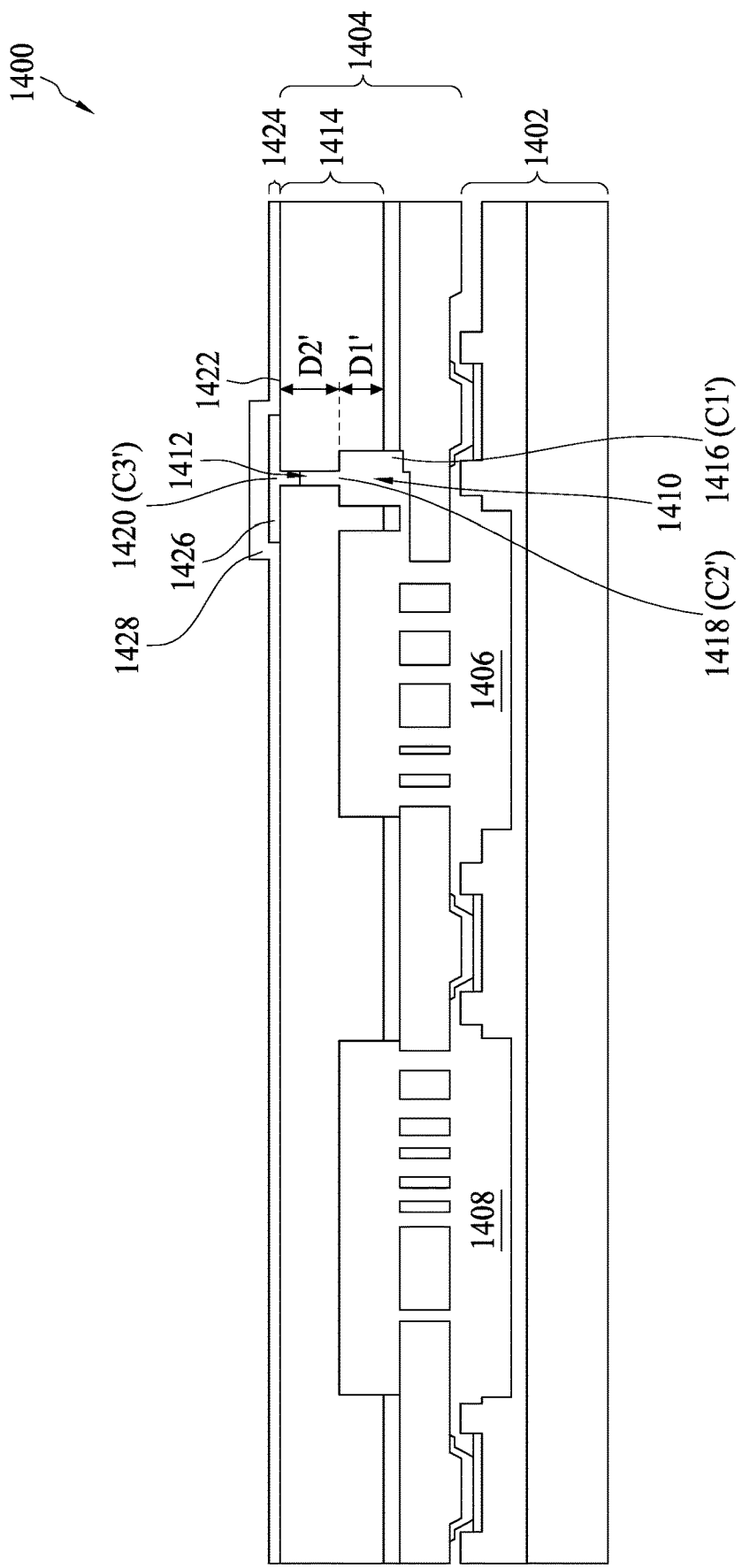
FIG. 14A is a cross-sectional view of a semiconductor structure in accordance with some embodiments.

According to the embodiments of semiconductor structure 100 as shown in FIG. 1, the second hole 1047 is larger than the first hole 1046. This is not a limitation of the present disclosure. The second hole 1047 may be smaller than the first hole 1046 as shown in FIG. 14A. FIG. 14A is a cross-sectional view of a semiconductor structure 1400 in accordance with some embodiments. Similar to the semiconductor structure 100, the semiconductor structure 1400 comprises two devices bonded to each other, wherein the first device is a CMOS device 1402 and the second device is a MEMS device 1404. The MEMS device 1404 is disposed opposite and contacted to the CMOS device 1402. A first chamber 1406 and a second chamber 1408 are formed between the MEMS device 1404 and the CMOS device 1402. The first chamber 1406 and the second chamber 1408 are two separate chambers with different pressures. For example, the first chamber 1406 may have one atmospheric pressure. The second chamber 1408 may have a vacuum pressure. However, this is not a limitation of the present disclosure.

Figure 14B:
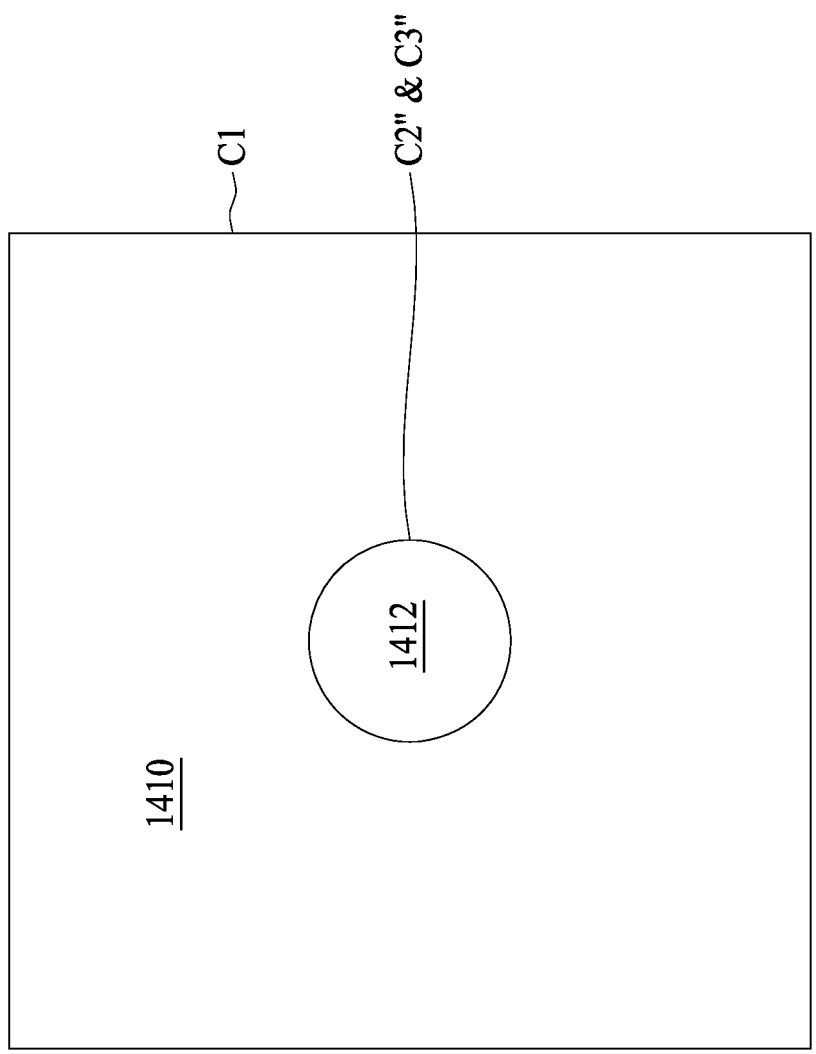
FIG. 14B is a top view of a first hole and a second hole in accordance with some embodiments.

Basically, the configuration of the semiconductor structure 1400 is similar to the semiconductor structure 100, except for a first hole 1410 and a second hole 1412 in the MEMS device 1404. Therefore, the detailed description of the semiconductor structure 1400 is omitted here for brevity. FIG. 14B is a top view of the first hole 1410 and the second hole 1412 in accordance with some embodiments.

According to the semiconductor structure 1400, the first hole 1410 and the second hole 1412 are disposed in the cap wafer 1414. The first hole 1410 is defined between a first end 1416 with a first circumference C1' and a second end 1418 with a second circumference C2'. The first end 1416 links with the first chamber 1406. The second hole 1412 is aligned to the first hole 1410, and the second hole 1412 is linked to the first hole 1410 at the second end 1418 of the first hole 1410. The second hole 1412 is defined between the second end 1418 and a third end 1420 with a third circumference C3'. The third end 1420 is open on the outer surface 1422 of the cap wafer 1414. The first circumference C1' is different from the second circumference C2'. Specifically, the first circumference C1' is larger than the second circumference C2', and the second circumference C2' is similar to the third circumference C3' as shown in FIG. 14A and FIG. 14B.

The semiconductor structure 1400 further comprises a sealing object 1424 for sealing the second hole 1412. Specifically, the sealing object 1424 comprises an oxide layer 1426 and a metal layer 1428. The oxide layer 1426 is disposed over the second hole 1412 in order to seal the third end 1420. The metal layer 1428 is disposed over the oxide layer 1426 and the outer surface 1422 of the cap wafer 1414. The material of the metal layer 1428 may be Al or AlCu.

The first hole 1410 is a cylindrical profile with a depth of D1'. As shown in FIG. 14A and FIG. 14B, the first circumference C1' of the opening of the first end 1416 is larger than the second circumference C2' of the opening of the second end 1418. The second hole 1047 is a cylindrical profile with a depth of D2' from the outer surface 1422 of the cap wafer 1414. As the first hole 1410 is a recess with the depth of D1', the depth of the second hole 1412 can be shortened to D2' rather than D1'+D2'. D1' is about 10 um~60 um, while D2' is about 80 um~150 um. The width W' of the second hole 1412 is about 1 um~3 um. Moreover, the third circumference C3' of the opening of the third end 1420 is much smaller than the first circumference C1' of the first hole 1410. Accordingly, when the sealing object 1424 is disposed on the second hole 1412, the opening of the third end 1420 is much easier to be sealed by the sealing object 1424. Specifically, according to the present disclosure, the sealing object 1424 is deposited on the surface 1422 of the cap wafer 1414 in order to seal the opening of the third end 1420 of the second hole 1412. The sealing object 1424 is not arranged to seal the bottom opening (i.e. the first end 1416) of the first hole 1410. Therefore, the sealing object 1424 can hermetically seal the first chamber 1406. For example, after the deposition of a SAM coating upon the surface of the first chamber 1406, a sub-atmospheric chemical vapor deposition (SACVD) process can be performed to dispose the oxide layer 1426 over the second end 1420 in order to seal the second hole 1412. Then, a deposition process can be performed to dispose the metal layer 1428 over the oxide layer 1426.

Figure 15:
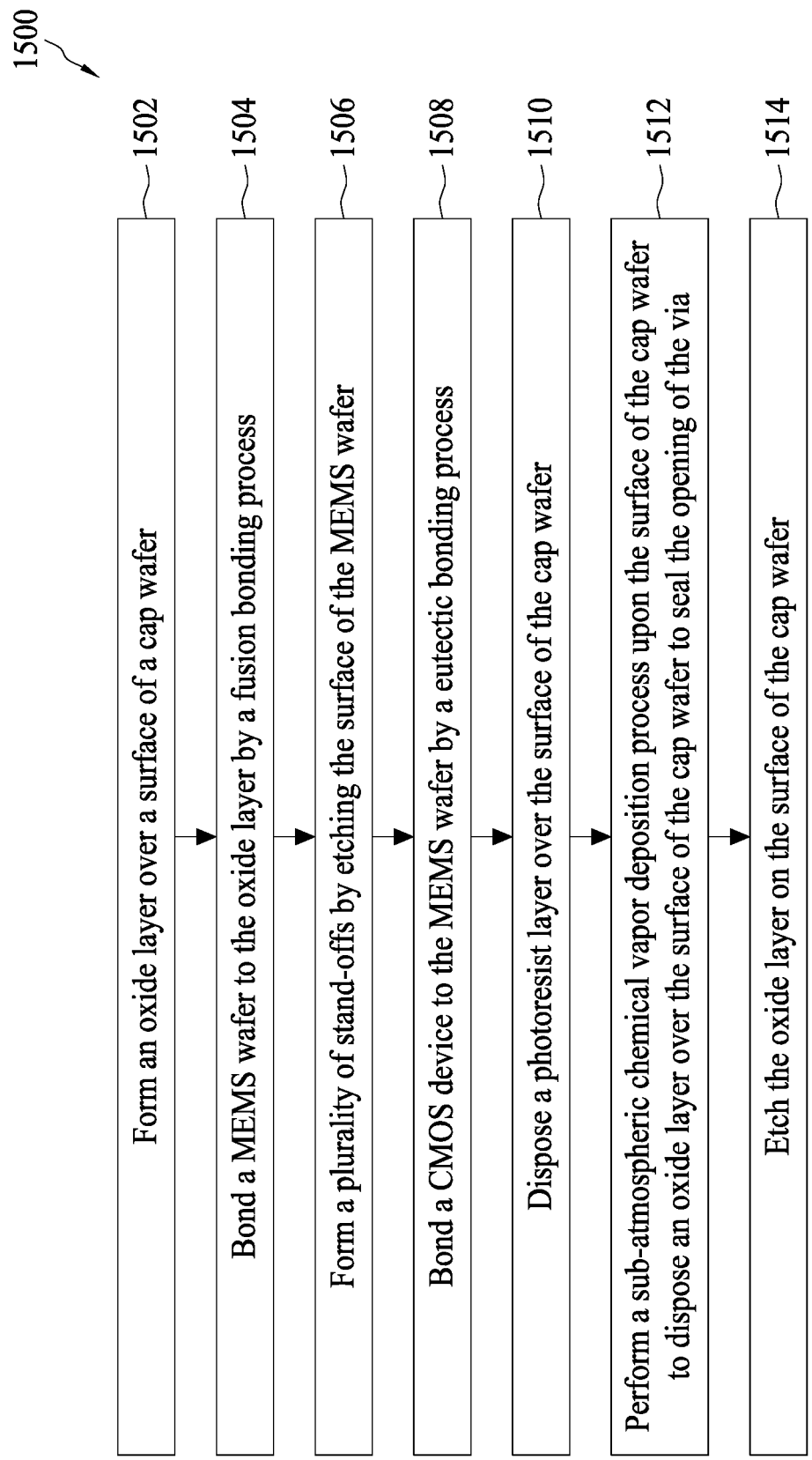
FIG. 15 is a flow diagram illustrating a method of fabricating a semiconductor structure in accordance with some embodiments.
Figure 16:
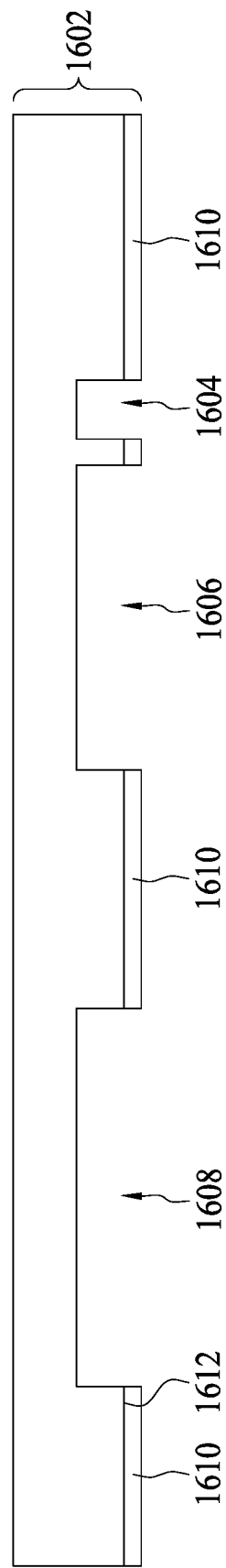
FIG. 16 is a cross-sectional view of a cap wafer with a trench, a first cavity, and a second cavity formed during a fabricating process in accordance with some embodiments.
Figure 17:
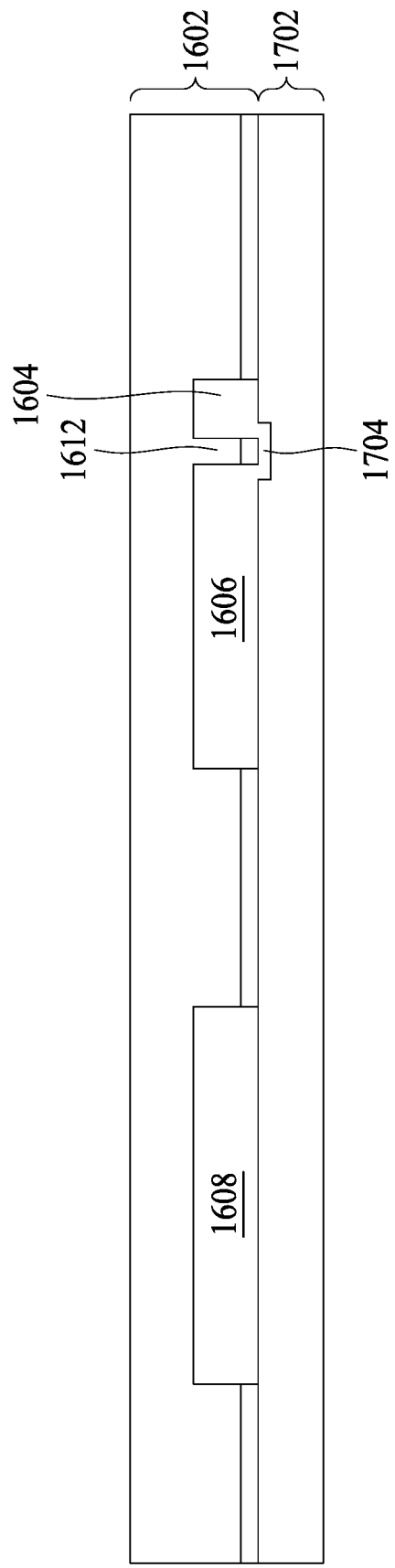
FIG. 17 is a cross-sectional view of a cap wafer and a MEMS wafer formed during a fabricating process in accordance with some embodiments.
Figure 18:
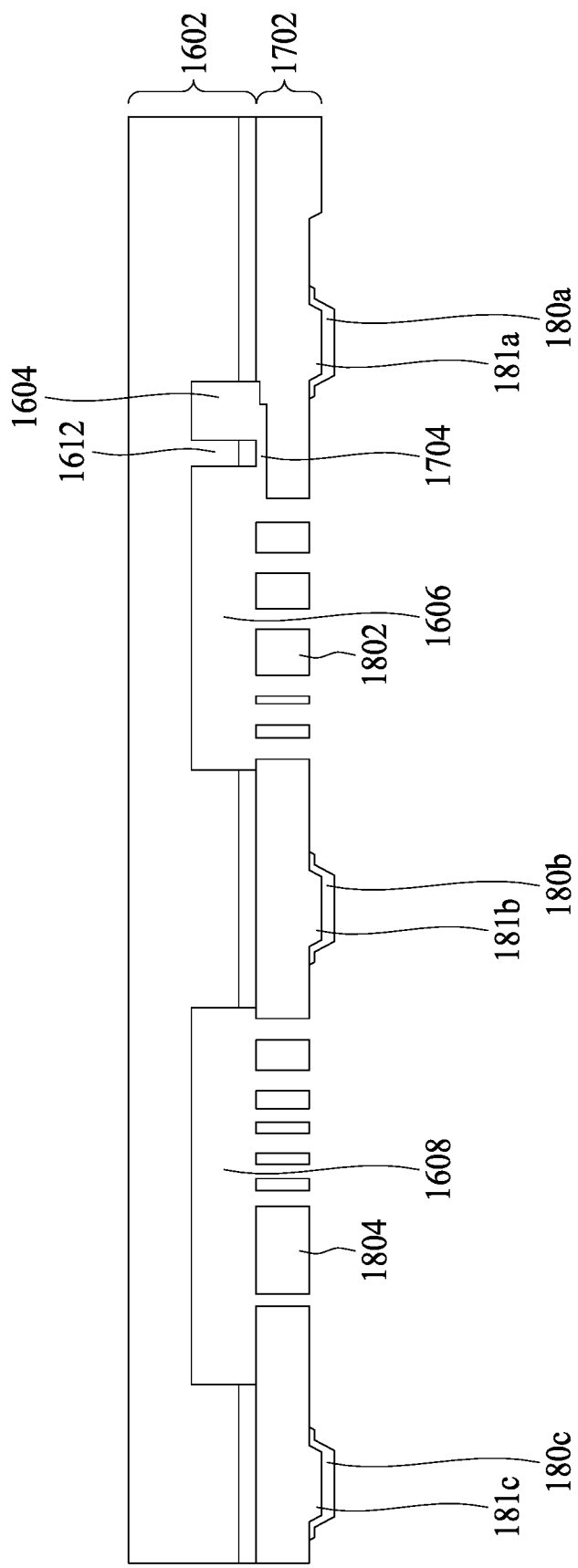
FIG. 18 is a cross-sectional view of a MEMS device with a plurality of bonding metals, a first spring structure, and a second spring structure formed during a fabricating process in accordance with some embodiments.
Figure 19:
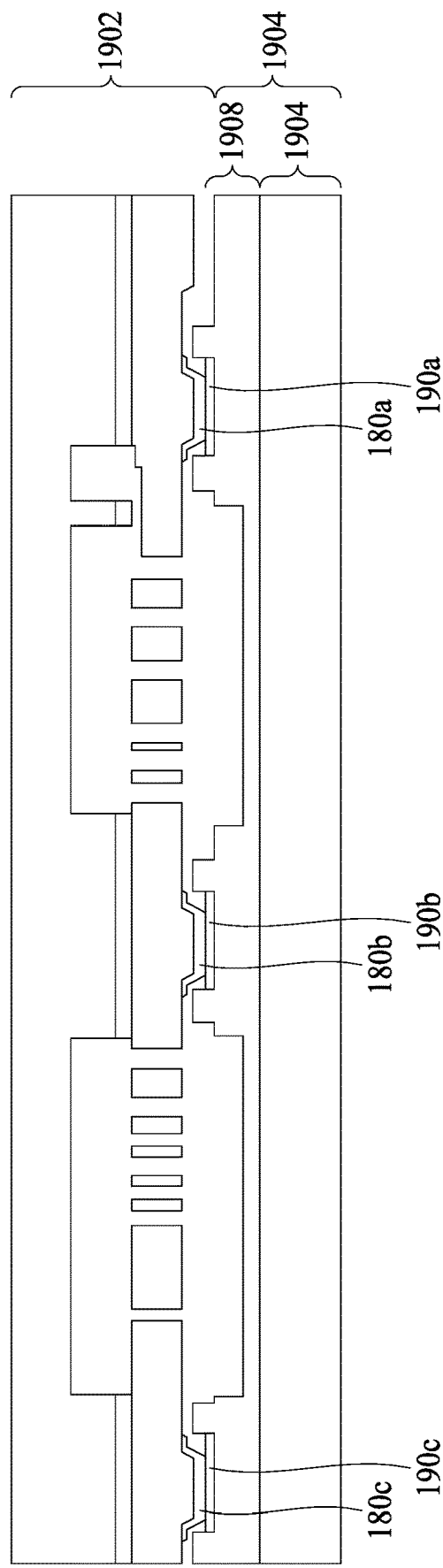
FIG. 19 is a cross-sectional view of a MEMS device and a CMOS device formed during a fabricating process in accordance with some embodiments.
Figure 20:
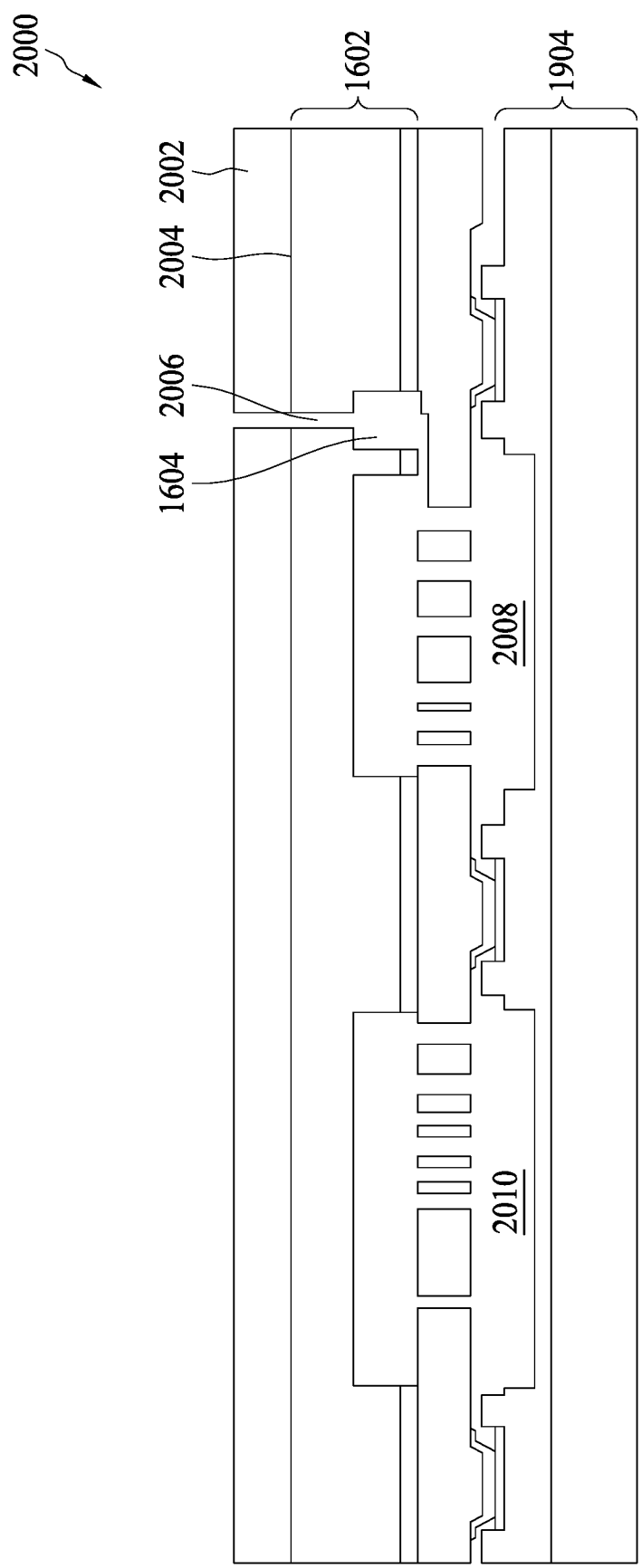
FIG. 20 is a cross-sectional view of a semiconductor structure with an opening formed during a fabricating process in accordance with some embodiments.
Figure 21:
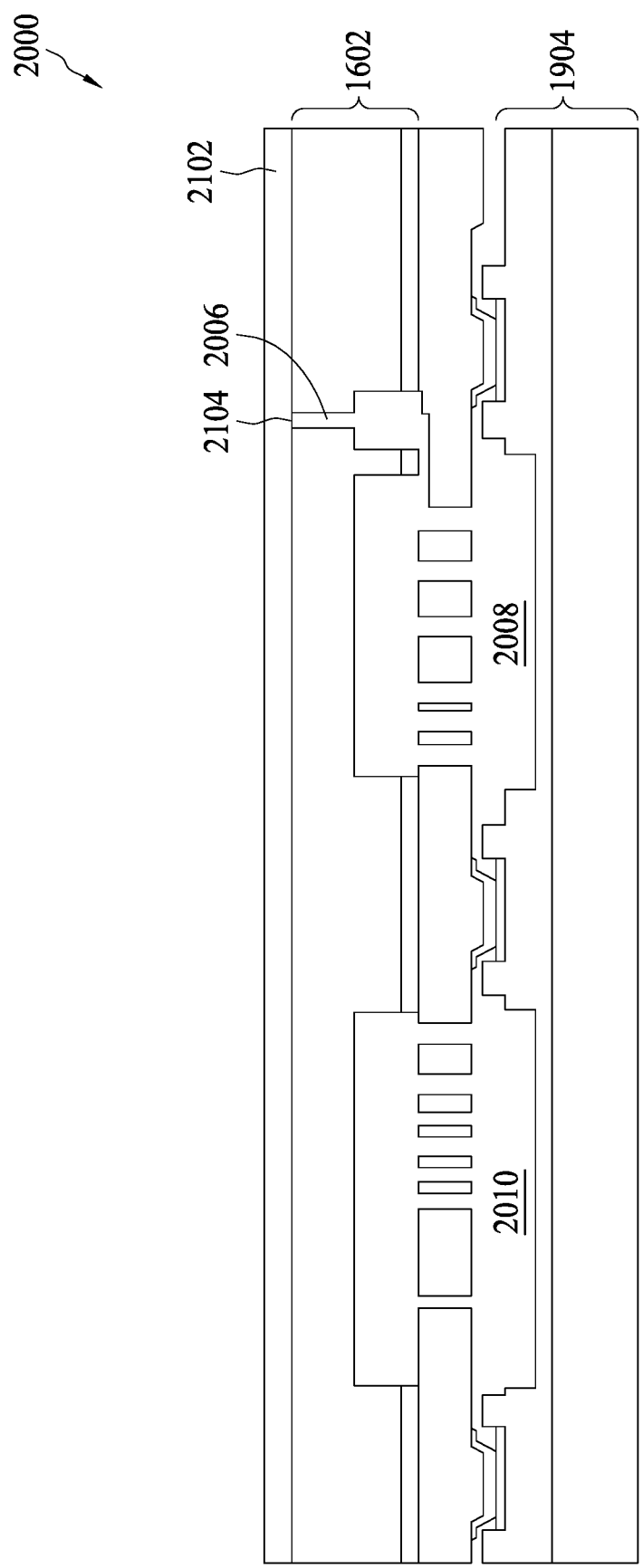
FIG. 21 is a cross-sectional view of a semiconductor structure with an oxide layer sealing the opening during a fabricating process in accordance with some embodiments.
Figure 22:
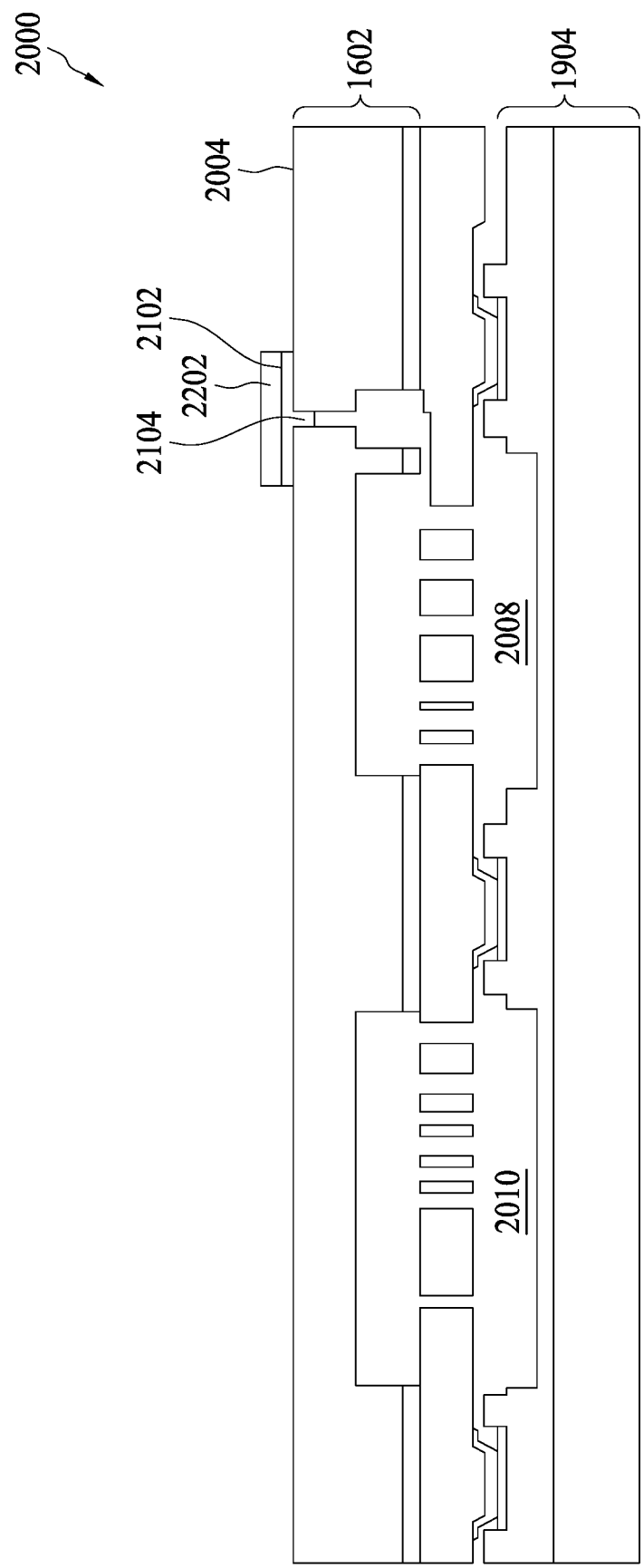
FIG. 22 is a cross-sectional view of a semiconductor structure with an etched oxide layer sealing an opening during a fabricating process in accordance with some embodiments.

FIG. 15 is a flow diagram illustrating a method 1500 of fabricating the semiconductor structure 1400 in accordance with some embodiments. FIGS. 16~22 are diagrams illustrating stages in the fabrication of the semiconductor structure 1400 in accordance with some embodiments. Specifically, FIG. 16 is a cross-sectional view of the cap wafer 1602 with a trench 1604, a first cavity 1606, and a second cavity 1608 formed during the fabricating process in accordance with some embodiments. FIG. 17 is a cross-sectional view of the cap wafer 1602 and the MEMS wafer 1702 formed during the fabricating process in accordance with some embodiments. FIG. 18 is a cross-sectional view of the MEMS device 1702 with the plurality of bonding metals 180a~180c, the first spring structure 1802, and the second spring structure 1804 formed during the fabricating process in accordance with some embodiments. FIG. 19 is a cross-sectional view of a MEMS device 1902 and a CMOS device 1904 formed during the fabricating process in accordance with some embodiments. FIG. 20 is a cross-sectional view of the semiconductor structure 2000 with an opening formed during the fabricating process in accordance with some embodiments. FIG. 21 is a cross-sectional view of the semiconductor structure 2000 with an oxide layer sealing the opening during the fabricating process in accordance with some embodiments. FIG. 22 is a cross-sectional view of the semiconductor structure 2000 with an etched oxide layer sealing the opening during the fabricating process in accordance with some embodiments. The method is a simplified semiconductor process. Therefore, other steps or operations may be incorporated in the process.

Referring to FIG. 16, in operation 1502, an oxide layer 1610 is formed over the surface 1612 of the cap wafer 1602. Then, the oxide layer 1610 and the cap wafer 1602 are etched, resulting in the trench 1604, the first cavity 1606, and the second cavity 1608 on the positions corresponding to a hole (e.g. 1410), a first chamber (e.g. 1406) and a second chamber (e.g. 1408), respectively. The trench 1604 does not penetrate the cap wafer 1602. The depth of the trench 1604 is about 10~60 um. The width of the trench 1604 is about 10~60 um. The thickness of the cap wafer 1602 is about 400~700 um. The oxide layer 1610 may be a TEOS oxide layer. The TEOS oxide may be implemented by Tetraethyl Orthosilicate, Si(OC2H5)4.

Referring to FIG. 17, in operation 1504, the MEMS wafer 1702 is bonded to the oxide layer 1610 by a fusion bonding process. It is noted that the MEMS wafer 1702 has a recess 1702 on a position corresponding to a protrusion 1612 of the cap wafer 1602 such that the trench 1604 is linked to the first cavity 1606. Then, the cap wafer 1602 is thinned down to a thickness of about 100~200 um. The MEMS wafer 1702 is also thinned down in operation 1504 so that the first hole 1410 can be subsequently defined.

Referring to FIG. 18, in operation 1506, a plurality of stand-offs 181a~181c is formed by etching the surface of the MEMS wafer 1702. The plurality of stand-offs 181a~181c is disposed by a plurality of bonding metals 180a~180c, respectively. The material of the bonding metals 180a~180c may be aluminum-copper (AlCu), germanium (Ge), platinum (Pt), aurum (Au), stannum (Sn), or copper (Cu). After the bonding metals 180a~180c are patterned over the stand-offs 181a~181c, respectively, a deep reactive-ion etching (DRIE) is performed upon the MEMS wafer 1702 to form a first spring structure 1802 and a second spring structure 1804 under the first cavity 1606 and the second cavity 1608, respectively.

Referring to FIG. 19, in operation 1508, the CMOS device 1904 is bonded to the MEMS wafer 1902 by a eutectic bonding process. The CMOS device 1904 comprises a substrate 1906 and a multi-layer structure 1908. The multi-layer structure 1908 comprises a plurality of bonding metals 190a~190c. The plurality of bonding metals 190a~190c is eutectically bonded with the plurality of bonding metals 180a~180c of the MEMS device 1902, respectively.

Referring to FIG. 20, in operation 1510, a photoresist layer 2002 is disposed over the surface 2002 of the cap wafer 1602. Then, the photoresist layer 2002 and the cap wafer 1602 are etched to form a via 2006, i.e. a hole, linking to the trench 1604. The length of the via 2006 inside the cap wafer 1602 is about 50~150 um, and the width of the via 2006 is about 1~3 um. Specifically, the position of the via 2006 is substantially above the trench 1604. The pointed end of the via 2006 exposes the top of the trench 1604. Then, the photoresist layer 2002 is removed, and a SAM coating is performed upon a first chamber 2008 by the opening of the via 2006. It is noted that a second chamber 2010 with a vacuum pressure is formed in the left side of the first chamber 2008.

Referring to FIG. 21, in operation 1512, a sub-atmospheric chemical vapor deposition (SACVD) process is performed upon the surface 2004 of the cap wafer 1602 to dispose an oxide layer 2102 over the surface 2004 of the cap wafer 1602 in order to seal the opening 2104 of the via 2006. As the via 2006 is a relatively small hole, the opening 2104 of the via 2006 can be easily sealed by the oxide layer 2102.

Referring to FIG. 22, in operation 1514, the oxide layer 2102 on the surface 2004 of the cap wafer 1602 is etched, except for the portion covered by a photoresist layer 2202. The photoresist layer 2202 is disposed above the via 2006. Then, the photoresist layer 2202 is removed, and a deposition process is performed upon the oxide layer 2102 and the surface 2004 of the cap wafer 1602 to dispose a metal layer (i.e. 1428 in FIG. 14A) over the oxide layer 2102 and the surface 2004 of the cap wafer 1602. The material of the metal layer may be aluminum (AL). As a result, the opening 2104 of the via 2006 is hermetically sealed by the oxide layer 2102 and the metal layer.

According to operations 1502~1514, the semiconductor structure 1400 having the first chamber 1406 with one atmospheric pressure and the second chamber 1408 with a vacuum pressure is fabricated, wherein the hole (i.e. 1412) of the first chamber 1406 is hermetically sealed.

Figure 23A:
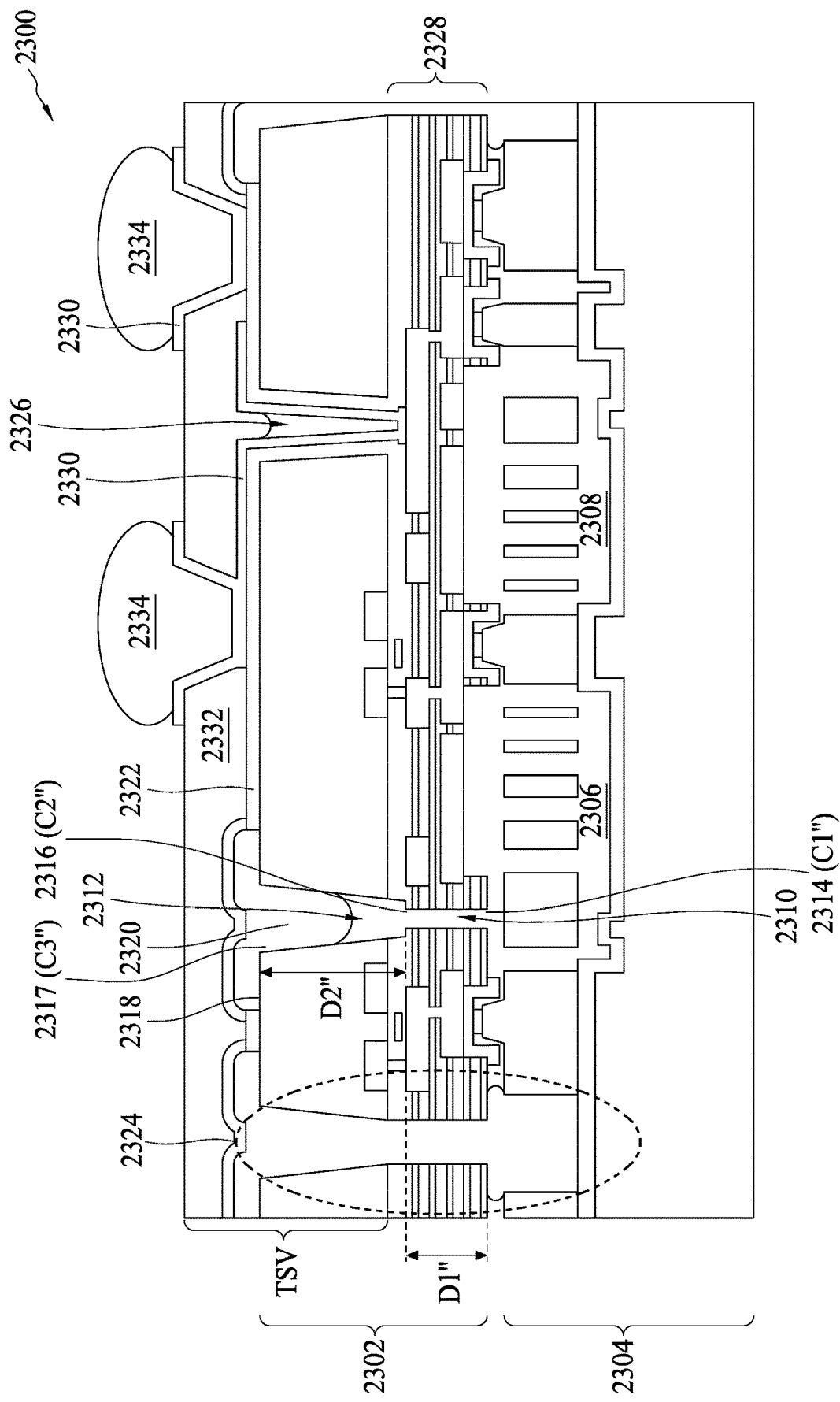
FIG. 23A is a cross-sectional view of a semiconductor structure in accordance with some embodiments.

According to the embodiments of semiconductor structure 100, the first hole 1046 and the second hole 1047 are disposed in the MEMS device 104. This is not a limitation of the present disclosure. The first hole 1046 and the second hole 1047 may be disposed in the CMOS device 102 as shown in FIG. 23A. FIG. 23A is a cross-sectional view of a semiconductor structure 2300 in accordance with some embodiments. Similar to the semiconductor structure 100, the semiconductor structure 2300 comprises two devices bonded to each other, the first device is a CMOS device 2302 and the second device is a MEMS device 2304. The MEMS device 2304 is disposed opposite and contacted to the CMOS device 2302. A first chamber 2306 and a second chamber 2308 are formed between the MEMS device 2304 and the CMOS device 2302. The first chamber 2306 and the second chamber 2308 are two separate chambers with different pressures. For example, the first chamber 2306 may have one atmospheric pressure. The second chamber 2308 may have a vacuum pressure. However, this is not a limitation of the present disclosure.

Figure 23B:
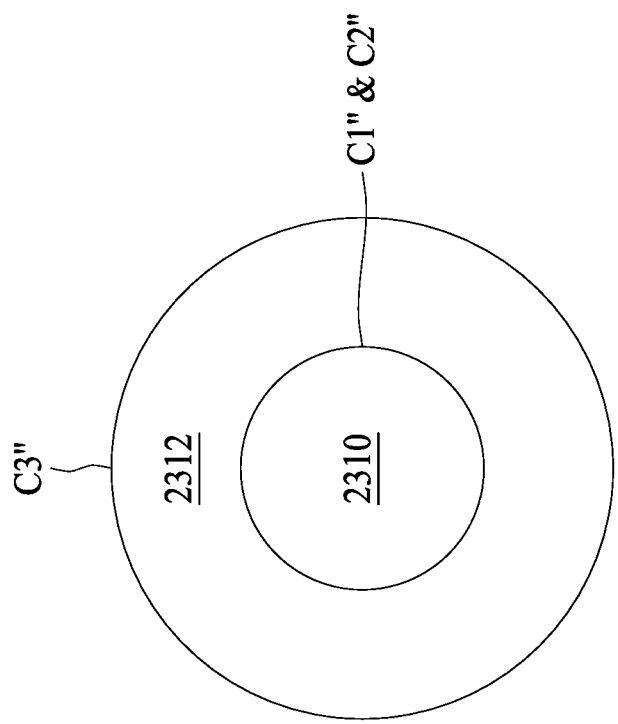
FIG. 23B is a top view of a first hole and a second hole in accordance with some embodiments.

Basically, the configuration of the semiconductor structure 2300 is similar to the semiconductor structure 100, except that a first hole 2310 and a second hole 2312 of the semiconductor structure 2300 are disposed in the CMOS device 2302. Therefore, the detailed description of the semiconductor structure 2300 is omitted here for brevity. FIG. 23B is a top view of the first hole 2310 and the second hole 2312 in accordance with some embodiments.

According to the semiconductor structure 2300, the first hole 2310 is a cylindrical profile with a depth of D1". As shown in FIG. 23A and FIG. 23B, the first circumference C1" of the opening of the first end 2314 is similar to the second circumference C2" of the opening of the second end 2316. The second hole 2312 is a tapered profile with a depth of D2" from a surface 2318 of the CMOS device 2302. The second hole 2312 has a third end 2317 with a third circumference C3". The third end 2317 is open on the surface 2318 of the CMOS device 2302. The second hole 2312 may be a through-oxide via (TSV) in the CMOS device 2302. The sealing object 2320 is disposed on the surface 2318 of the CMOS device 2302 such that the second hole 2312 is sealed. Specifically, according to the present disclosure, the sealing object 2320 is an epoxy material deposited in the second hole 2312 by a screen printing epoxy process. The sealing object 2320 is not arranged to seal the bottom opening (i.e. the first end 2314) of the first hole 2310. Therefore, the sealing object 2320 can hermetically seal the first chamber 2306. For example, after the deposition of a SAM coating upon the surface of the first chamber 2306, a screen printing epoxy process can be performed to dispose the epoxy material over the second hole 2312 in order to seal the first chamber 2306. Then, a deposition process can be performed to dispose an oxide layer 2322 over the sealing object 2320.

In addition, the CMOS device 2302 may comprise a scribe line 2324 and a through-oxide via 2326. The scribe line 2324 may be the margin of the semiconductor structure 2300. The scribe line 2324 is also disposed by the epoxy material during the screen printing epoxy process. The through-oxide via 2326 provides a channel to reach the multi-layer structure 2328 of the CMOS device 2302. The oxide layer 2322 is also disposed over the through-oxide via 2326 during the deposition process. A metal layer 2330 is disposed over the oxide layer 2322 of the through-oxide via 2326 to conduct the electrical signal to/from the CMOS device 2302. The material of the metal layer 2330 may be copper (Cu). An epoxy material layer 2332 is disposed over metal layer 2330 and the oxide layer 2322. Moreover, a ball grid array (BGA) 2334 is disposed over the metal layer 2330. The ball grid array 2332 may be regarded as the interconnection pins of the semiconductor structure 2300.

Figure 24:
FIG. 24 is a flow diagram illustrating a method of fabricating a semiconductor structure in accordance with some embodiments.
Figure 25:
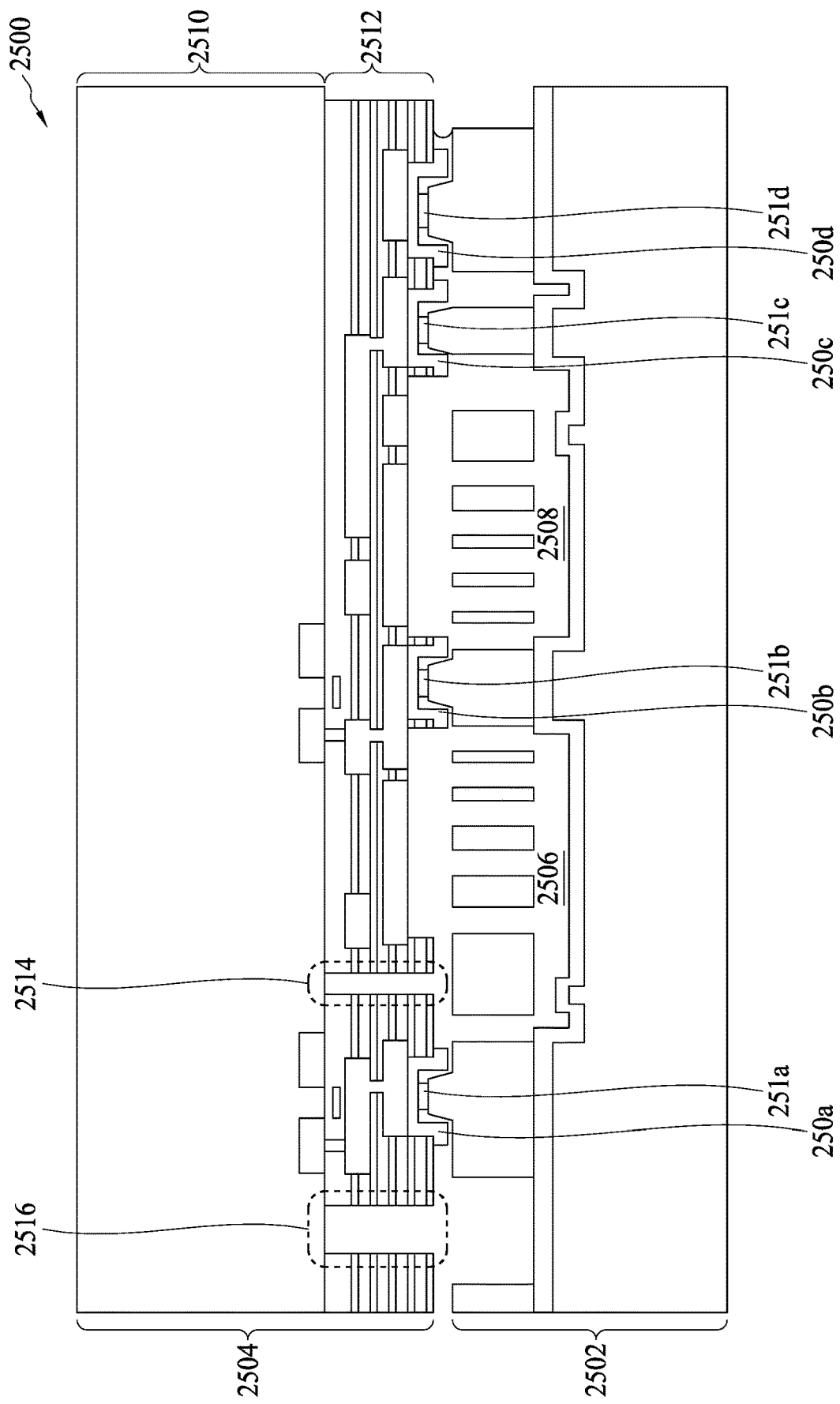
FIG. 25 is a cross-sectional view of a semiconductor structure having a MEMS device and a CMOS device formed during a fabricating process in accordance with some embodiments.
Figure 26:
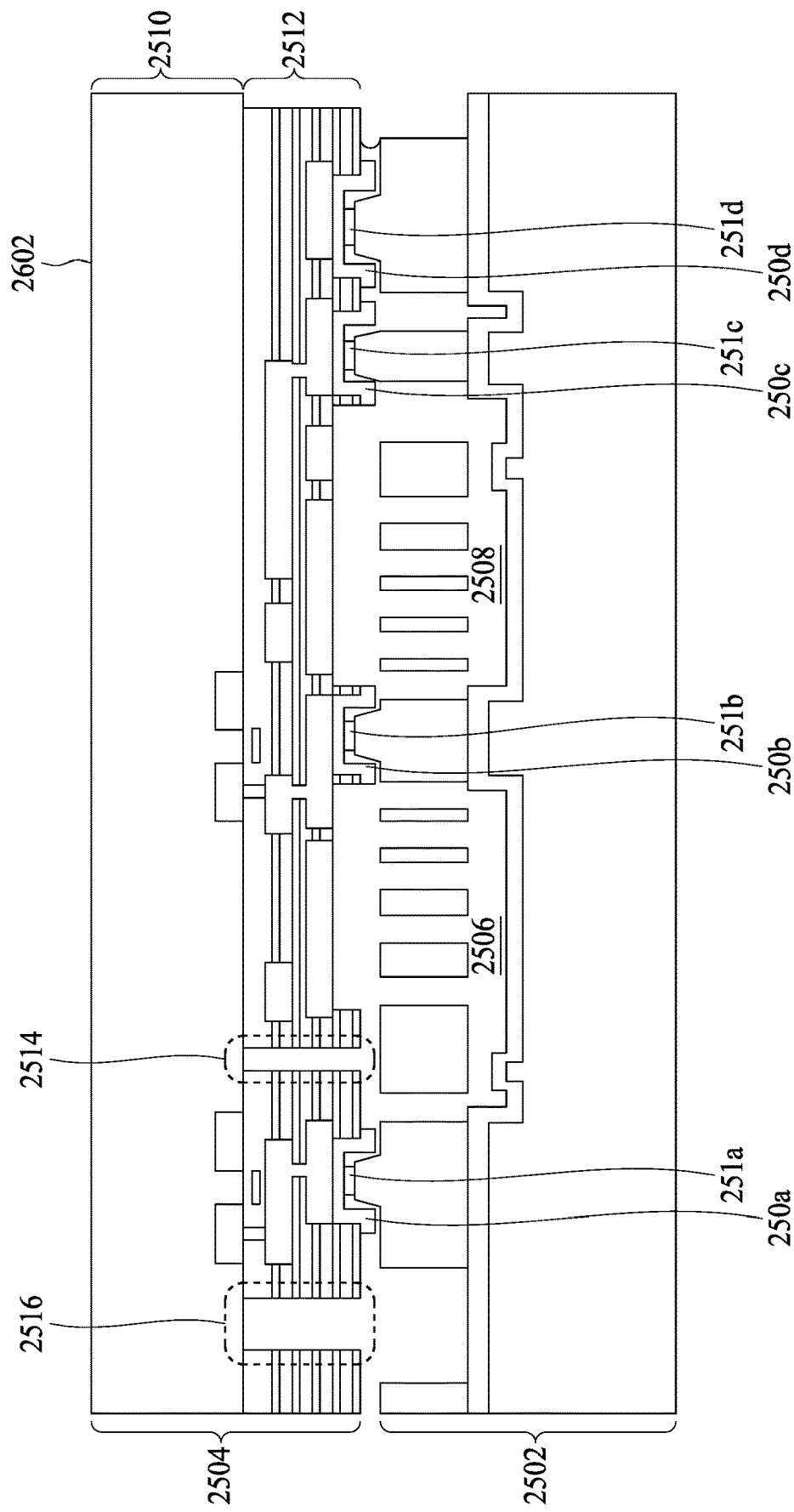
FIG. 26 is a cross-sectional view of a semiconductor structure with a thinning backside formed during a fabricating process in accordance with some embodiments.
Figure 27:
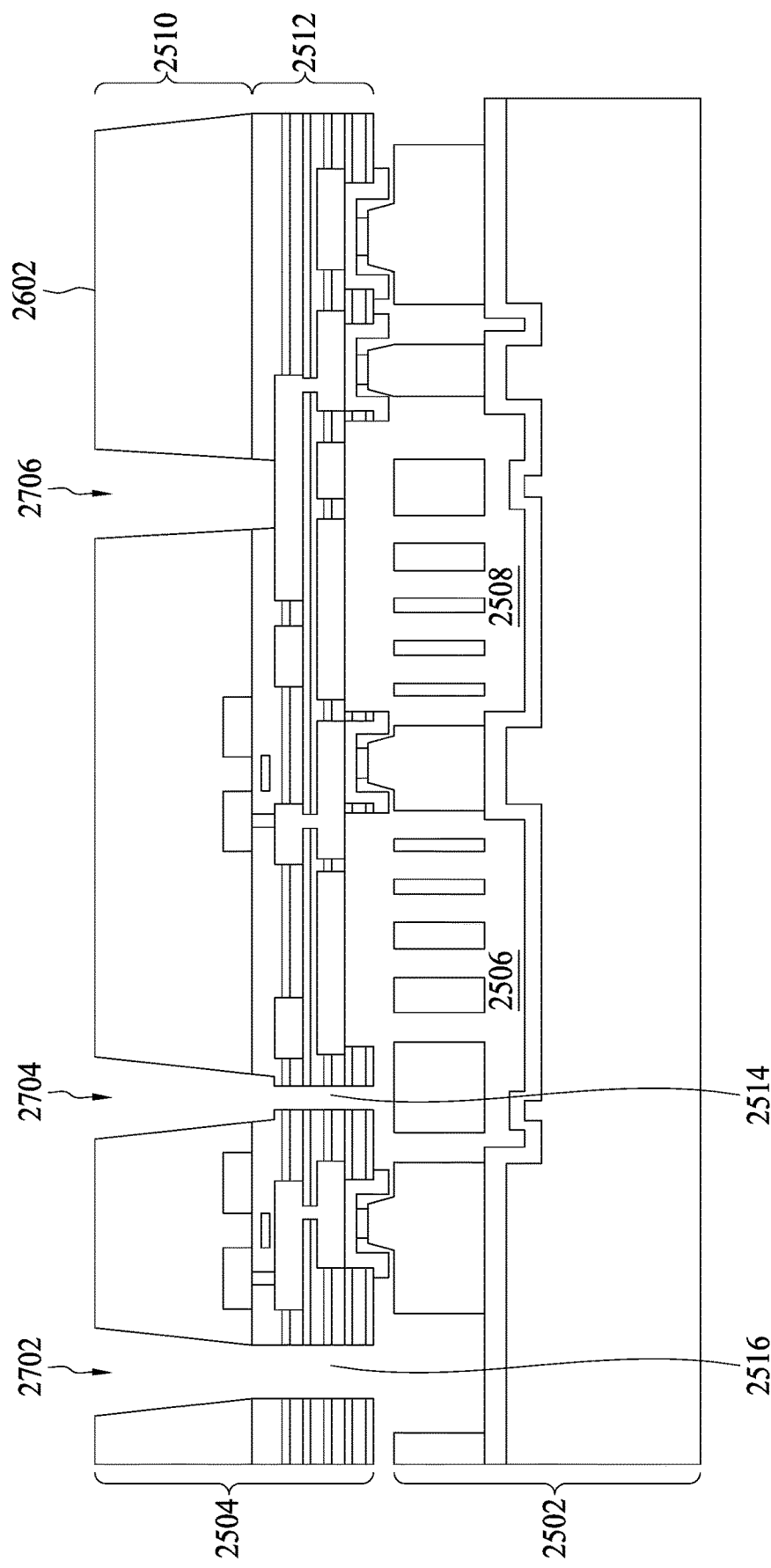
FIG. 27 is a cross-sectional view of a semiconductor structure with a plurality of through-oxide vias formed during a fabricating process in accordance with some embodiments.
Figure 28:
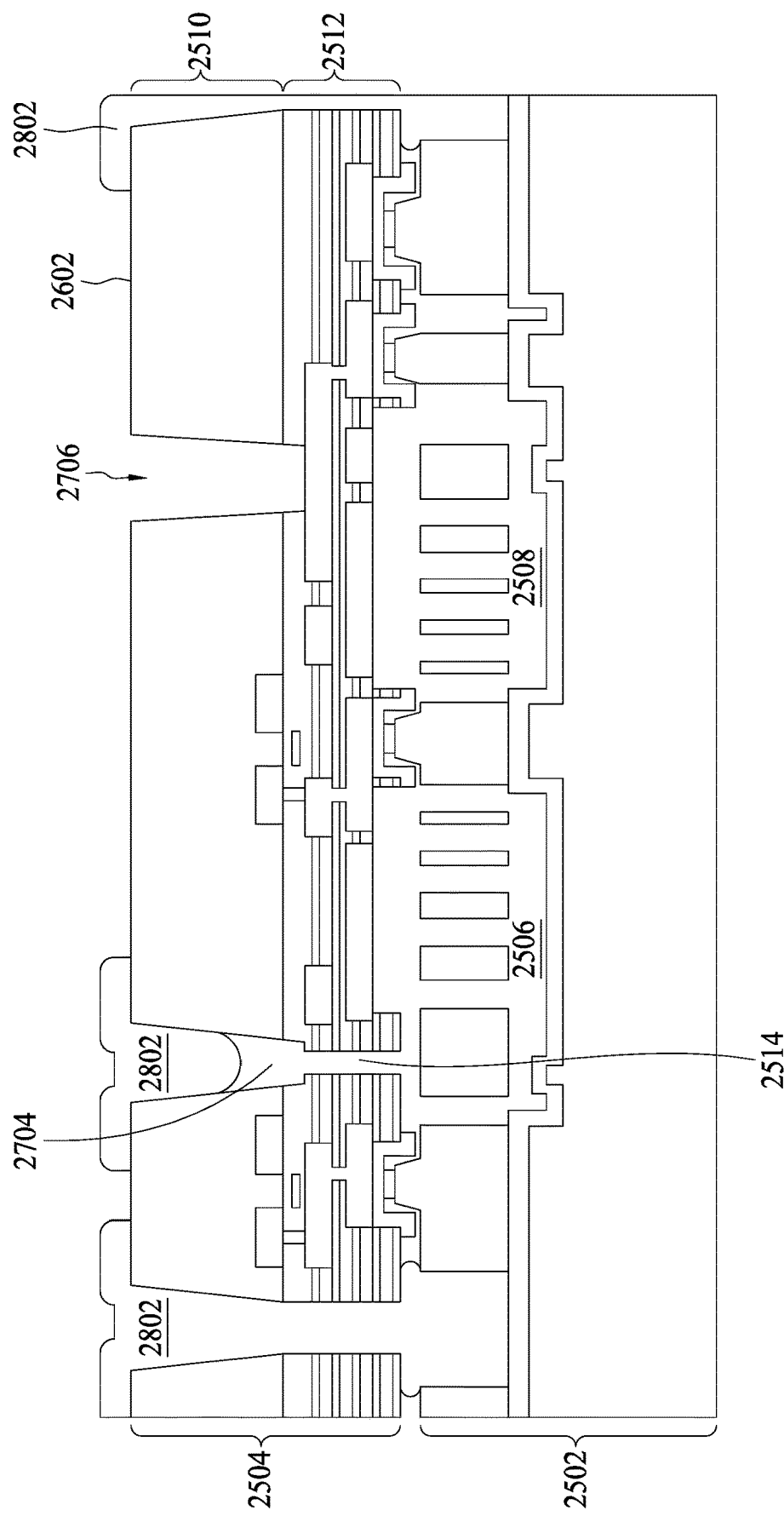
FIG. 28 is a cross-sectional view of a semiconductor structure with a sealing object formed during a fabricating process in accordance with some embodiments.
Figure 29:
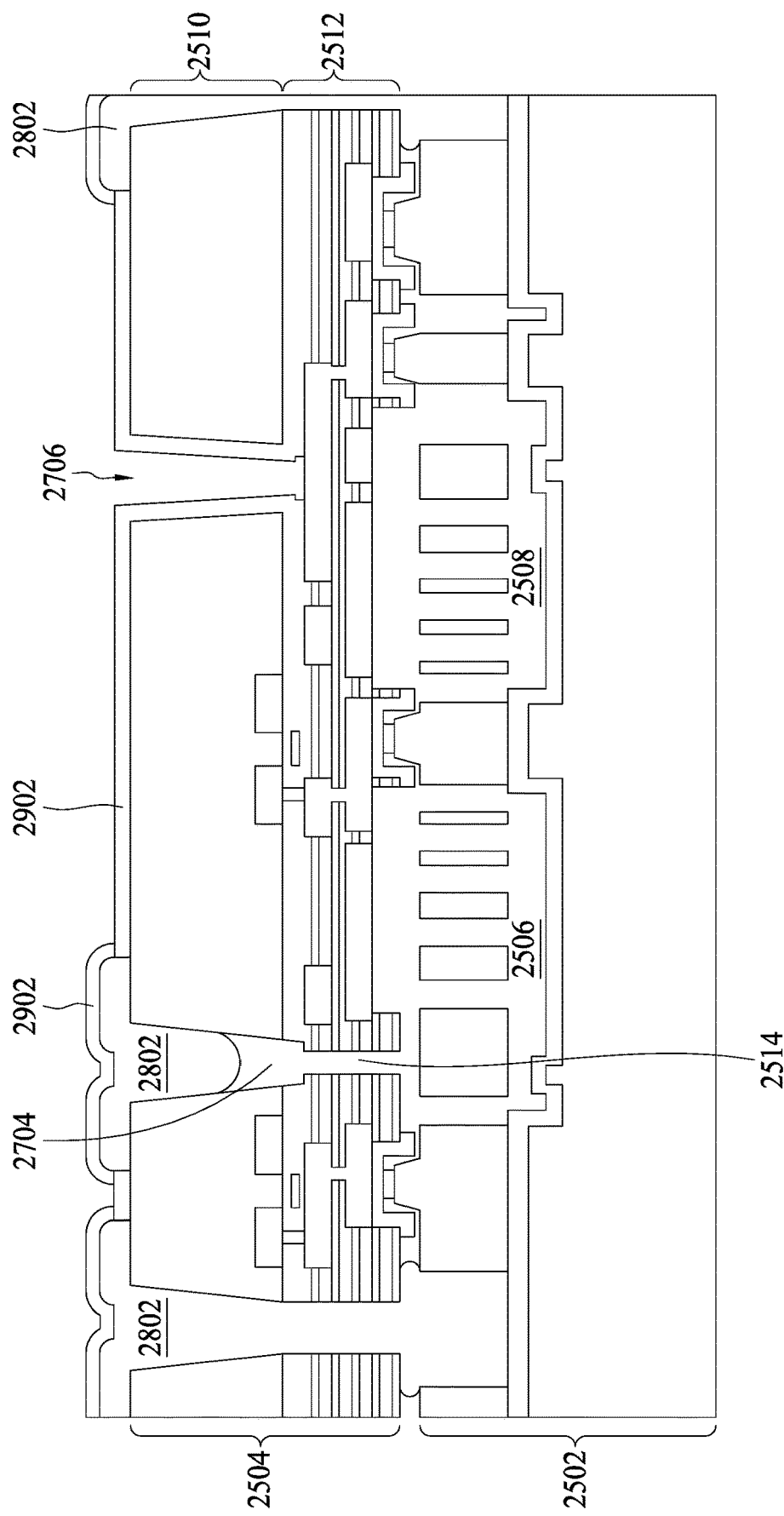
FIG. 29 is a cross-sectional view of a semiconductor structure with an oxide layer formed during a fabricating process in accordance with some embodiments.
Figure 30:
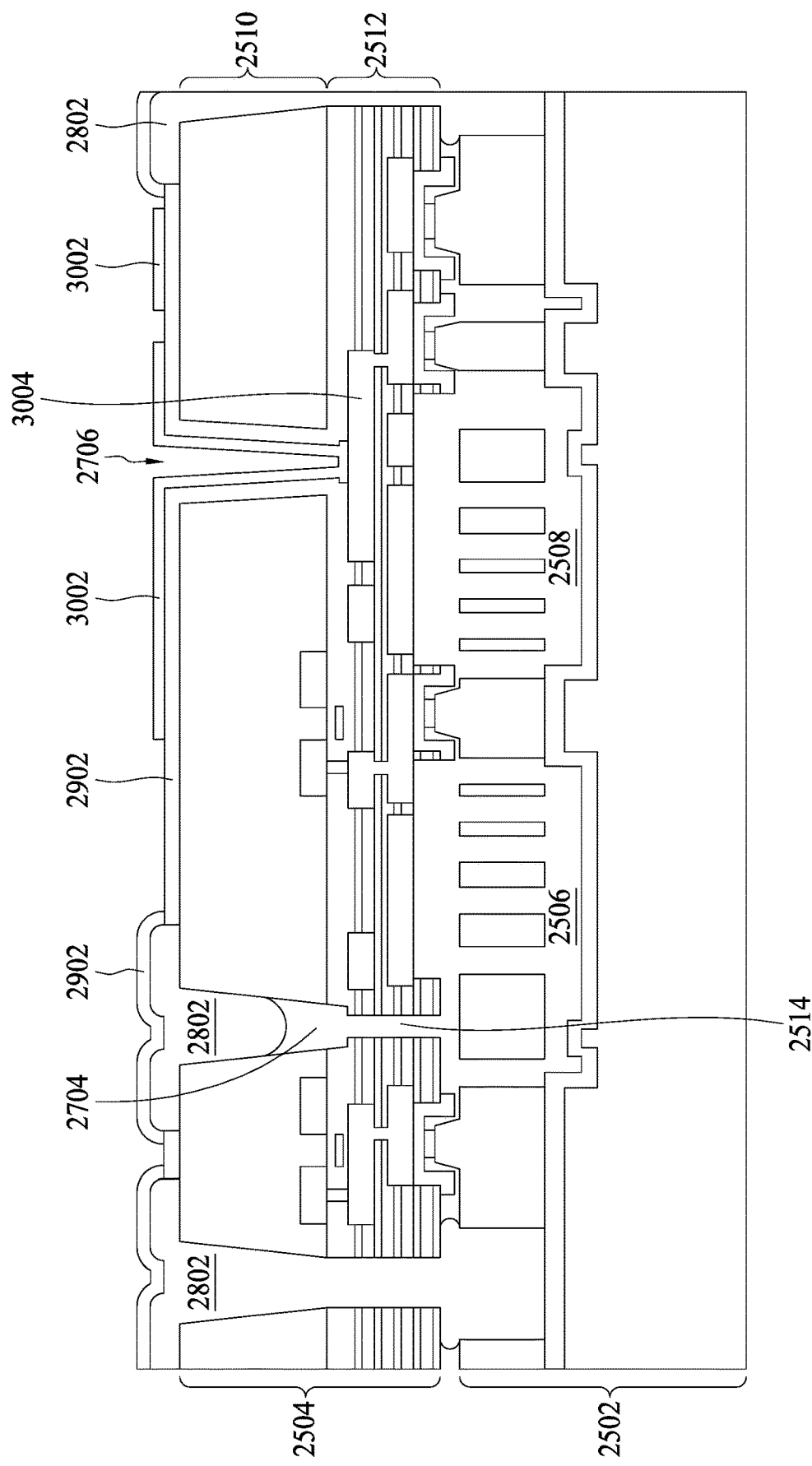
FIG. 30 is a cross-sectional view of a semiconductor structure with a metal layer formed during a fabricating process in accordance with some embodiments.
Figure 31:
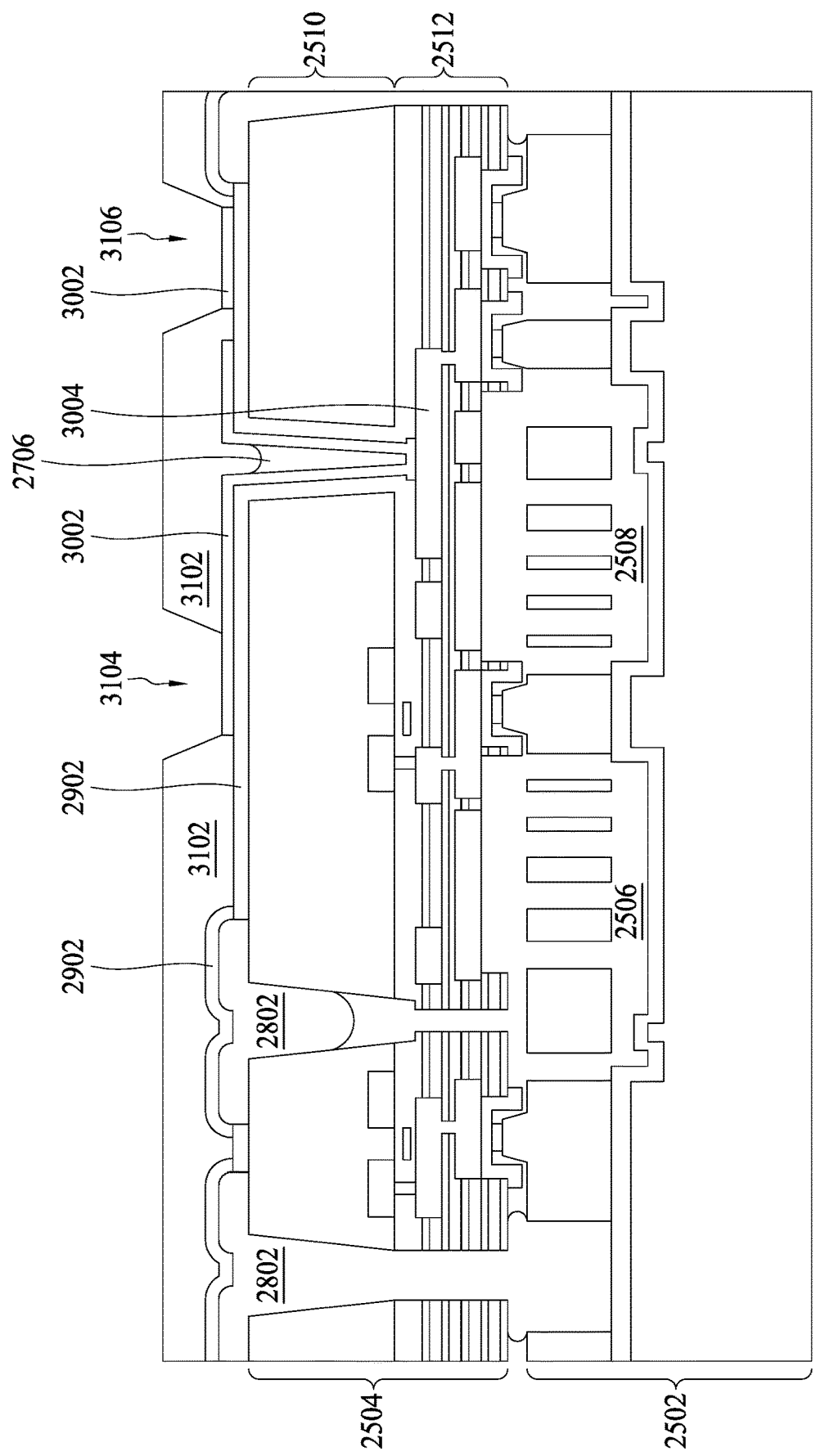
FIG. 31 is a cross-sectional view of a semiconductor structure with an epoxy layer formed during a fabricating process in accordance with some embodiments.
Figure 32:
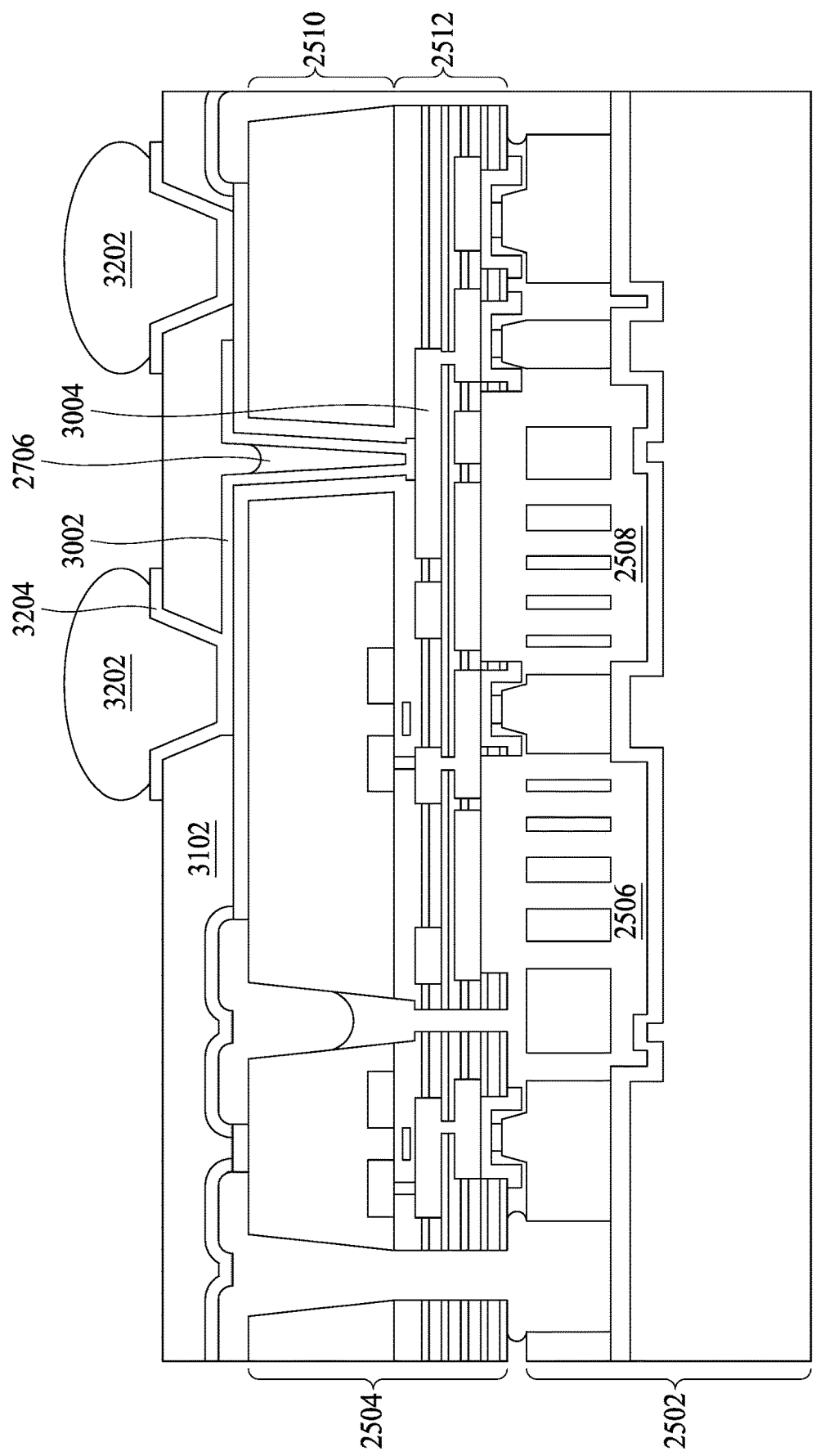
FIG. 32 is a cross-sectional view of a semiconductor structure having ball grid arrays during a fabricating process in accordance with some embodiments.

FIG. 24 is a flow diagram illustrating a method 2400 of fabricating the semiconductor structure 2300 in accordance with some embodiments. FIGS. 25~32 are diagrams illustrating stages in the fabrication of the semiconductor structure 2300 in accordance with some embodiments. Specifically, FIG. 25 is a cross-sectional view of a semiconductor structure 2500 having a MEMS device 2502 and a CMOS device 2504 formed during a fabricating process in accordance with some embodiments. FIG. 26 is a cross-sectional view of the semiconductor structure 2500 with a thinning backside 2602 formed during the fabricating process in accordance with some embodiments. FIG. 27 is a cross-sectional view of the semiconductor structure 2500 with a plurality of through-oxide vias 2702, 2704, 2706 formed during the fabricating process in accordance with some embodiments. FIG. 28 is a cross-sectional view of the semiconductor structure 2500 with a sealing object 2802 formed during the fabricating process in accordance with some embodiments. FIG. 29 is a cross-sectional view of the semiconductor structure 2500 with an oxide layer 2902 formed during the fabricating process in accordance with some embodiments. FIG. 30 is a cross-sectional view of the semiconductor structure 2500 with a metal layer 3002 formed during the fabricating process in accordance with some embodiments. FIG. 31 is a cross-sectional view of the semiconductor structure 2500 with an epoxy layer 3102 formed during the fabricating process in accordance with some embodiments. FIG. 32 is a cross-sectional view of the semiconductor structure 2500 having ball grid arrays 3202 during the fabricating process in accordance with some embodiments. The method is a simplified semiconductor process. Therefore, other steps or operations may be incorporated in the process.

Referring to FIG. 25, in operation 2402, the CMOS device 2504 is bonded to the MEMS wafer 2502 by a eutectic bonding process in order to form the semiconductor structure 2500. A first chamber 2506 and a second chamber 2508 are formed between the CMOS device 2504 and the MEMS wafer 2502. The first chamber 2506 and the second chamber 2508 have different pressures. The CMOS device 2504 comprises a substrate 2510 and a multi-layer structure 2512. A first hole 2514 and a second hole 2516 are formed to pass through the multi-layer structure 2512. The first hole 2514 is a cylindrical profile and linked to the first chamber 2506. The multi-layer structure 2512 further comprises a plurality of bonding metals 250a~250d. The plurality of bonding metals 250a~250d is eutectically bonded with a plurality of bonding metals 251a~251d of the MEMS wafer 2502, respectively.

Referring to FIG. 26, in operation 2404, the backside 2602 of the CMOS device 2504 is thinned by a backside thinning process so as to resize the substrate 2510 with an appropriate thickness.

Referring to FIG. 27, in operation 2406, the surface of the backside 2602 of the CMOS device 2504 is etched to form the through-oxide vias 2702, 2704, 2706. The through-oxide vias 2702, 2704, 2706 are in tapered profiles. The position of the through-oxide via 2702 is substantially above the second hole 2516, and the through-oxide via 2702 aligns to the second hole 2516. The through-oxide via 2702 also links to the second hole 2516. The position of the through-oxide via 2704 is substantially above the first hole 2514. The bottom 2708 of the through-oxide via 2704 links to the first hole 2514. The through-oxide via 2706 exposes a top metal layer in the multi-layer structure 2512. Then, a SAM coating is performed upon the first chamber 2506 by the through-oxide via 2704 and the first hole 2514. It is noted that the second chamber 2508 with a vacuum pressure is formed in the right side of the first chamber 2506.

Referring to FIG. 28, in operation 2408, a screen printing epoxy process is performed upon the through-oxide vias 2702, 2704 to fill the through-oxide via 2702 and the second hole 2516 and to seal the through-oxide via 2704 by using the sealing object 2802. The sealing object 2802 is an epoxy material or a polymer. It is noted that the epoxy material is only disposed on the upper part of the through-oxide via 2704 in order to seal the first chamber 2506. Then, the opening of the through-oxide via 2704 is hermetically sealed by the sealing object 2802.

Referring to FIG. 29, in operation 2410, a deposition process is performed upon the sealing object 2802, the surface of the backside 2602 of the CMOS device 2504, and the through-oxide via 2706 in order to form the oxide layer 2902 thereon.

Referring to FIG. 30, in operation 2412, a metal plating process is performed to pattern the metal layer 3002 over the through-oxide via 2706 and a portion of the oxide layer 2902. The metal layer 3002 is contacted with a top metal layer 3004 of the multi-layer structure 2512. The material of the metal layer 3004 is copper (Cu).

Referring to FIG. 31, in operation 2414, an epoxy coating process is performed to pattern the epoxy layer 3102 over the oxide layer 2902, the through-oxide via 2706, and a portion of metal layer 3002. A first epoxy recess 3104 and a second epoxy recess 3106 expose the metal layer 3002. In addition, the epoxy layer 3102 also seals the upper opening of the through-oxide via 2706 as shown in FIG. 31. The epoxy layer 3102 may be a polymer.

Referring to FIG. 32, in operation 2416, the ball grid arrays 3202 are disposed on the first epoxy recess 3104 and the second epoxy recess 3106 in order to contact the metal layer 3002. It is noted that the inner surfaces of the first epoxy recess 3104 and the second epoxy recess 3106 may further be plated by a metal layer 3204 in order to increase the contact area between the ball grid arrays 3202 and the metal layer 3002 as shown in FIG. 32.

According to operations 2402~2416, the semiconductor structure 2300 having the first chamber 2306 with one atmospheric pressure and the second chamber 2308 with a vacuum pressure is fabricated, wherein the hole (i.e. 2310 and 2312) of the first chamber 2306 is hermetically sealed.

Briefly, according to the embodiments, the hole of the high pressure chamber (e.g. 106) can be implemented in the MEMS device (e.g. 104) or CMOS device (e.g. 2302) of a semiconductor structure. The hole is divided into two parts, i.e. a lower hole (e.g. 1046) and an upper hole (e.g. 1047). The lower hole is closer than the high pressure chamber in comparison to the upper hole. The lower hole is linked to the high pressure chamber and is pre-etched or pre-set in the MEMS device or the CMOS device. The upper hole is etched to link to or to expose the lower hole after the MEMS device is eutectically bonded to the CMOS device. Therefore, the depth to etch to the high pressure chamber is decreased. Moreover, the lower hole and the upper hole are designed to have different sizes or different circumferences. When the upper hole is designed to be larger than the lower hole, it is easier to perform the SAM coating upon the high pressure chamber through the upper hole. In addition, the hole of the high pressure chamber can be hermetically sealed by an oxide layer when the opening (e.g. 903 or 2104) of the hole is small.

In some embodiments of the present disclosure, a semiconductor structure is disclosed. The semiconductor structure comprises a first device, a second device, a first hole, a second hole, and a sealing object. The second device is contacted with the first device, wherein a chamber is formed between the first device and the second device. The first hole is disposed in the second device and defined between a first end with a first circumference and a second end with a second circumference. The second hole is disposed in the second device and aligned to the first hole. The sealing object seals the second hole. The first end links with the chamber, and the first circumference is different from the second circumference, the second hole is defined between the second end and a third end with a third circumference, and the second circumference and the third circumference are smaller than the first circumference.

In some embodiments of the present disclosure, a method of fabricating a semiconductor structure is disclosed. The method comprises: providing a first device; contacting a second device to the first device with a chamber between the first device and the second device; forming a first hole in the second device between a first end with a first circumference and a second end with a second circumference; forming a second hole in the second device to align to the first hole; and sealing the second hole by using a sealing object; wherein the first end links with the chamber, and the first circumference is different from the second circumference, the second hole is defined between the second end and a third end with a third circumference, and the second circumference and the third circumference are smaller than the first circumference.

In some embodiments of the present disclosure, a semiconductor structure is disclosed. The semiconductor structure comprises a semiconductor device, a cap wafer, a first hole, a second hole, and a sealing object. The cap wafer is disposed over the semiconductor device. A chamber is formed between the semiconductor device and the cap wafer. The first hole is disposed in the cap wafer and defined between a first end with a first circumference and a second end with a second circumference. The second hole is disposed in the cap wafer and aligned to the first hole. The sealing object is for sealing the second hole. The first end links with the chamber, and the first circumference is different from the second circumference, the second hole is defined between the second end and a third end with a third circumference, and the second circumference and the third circumference are smaller than the first circumference.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a complementary metal oxide semiconductor (CMOS) device; and
   a micro-electro mechanical system (MEMS) device bonded to the CMOS device, the MEMS device comprising:
      a cap wafer, the cap wafer comprising:
         a base portion, defining a second hole of the cap wafer;
         a first wall portion, extending from the base portion, disposed between a first hole of the cap wafer and a first cavity of the cap wafer, the second hole disposed on and aligned to the first hole, the second hole being smaller than the first hole, the first hole vertically defined between a first end with a first circumference and a second end with a second circumference, the first cavity, the first hole and the second hole having an atmospheric pressure; and
         a second wall portion, extending from the base portion, the first and second wall portions disposed on two opposite sides of the first hole;
      a MEMS wafer, disposed under the cap wafer, the MEMS wafer comprising a three-stair structure, the three-stair structure comprising:
         a fourth surface corresponding the second wall portion of the cap wafer; and
         a fifth surface corresponding the first wall portion of the cap wafer, wherein the fifth surface is parallel to and lower than the fourth surface;
      an intermedium oxide layer sandwiched between the MEMS wafer and the cap wafer, the intermedium oxide layer sandwiched between and contacting the second wall portion of the cap wafer and the fourth surface of the MEMS wafer; and
      a sealing object, for sealing the second hole, wherein the sealing object comprises a metal layer which is free from filling into the second hole, and an oxide layer including a portion disposed on a same plane with the metal layer;
   wherein the first end links with the first cavity, and the first circumference is different from the second circumference, the second hole is defined between the second end and a third end with a third circumference, and the second circumference and the third circumference are smaller than the first circumference.

2. The semiconductor structure of claim 1, wherein the intermedium oxide layer comprises a first oxide portion covering a bottom surface of the first wall portion, and the fifth surface is lower than a bottom surface of the first oxide portion.

3. The semiconductor structure of claim 2, wherein the MEMS wafer comprises a spring structure, and the fifth surface is lower than a top surface of the spring structure.

4. The semiconductor structure of claim 3, wherein the three-stair structure further comprises a sixth surface, the sixth surface is parallel to and lower than the fourth surface and higher than the fifth surface.

5. The semiconductor structure of claim 4, wherein the bottom surface of the first oxide portion, the fourth surface and the top surface of the spring structure are at the same height.

6. The semiconductor structure of claim 4, wherein the first oxide portion directly faces the fifth surface.

7. The semiconductor structure of claim 4, wherein the first hole is right above the fifth surface and the sixth surface.

8. The semiconductor structure of claim 4, wherein the first cavity is right above the spring structure and the fifth surface.

9. A method of fabricating a semiconductor structure, comprising:
providing a complementary metal oxide semiconductor (CMOS) device; and
providing a micro-electro mechanical system (MEMS) device bonded to the CMOS device, comprising:
providing a cap wafer, comprising:
forming a base portion defining a second hole of the cap wafer;
forming a first wall portion extending from the base portion and disposed between a first hole of the cap wafer and a first cavity of the cap wafer, wherein the second hole is disposed on and aligned to the first hole, the second hole is smaller than the first hole, the first hole vertically is defined between a first end with a first circumference and a second end with a second circumference, and the first cavity, the first hole and the second hole have an atmospheric pressure; and
forming a second wall portion extending from the base portion, wherein the first and second wall portions are disposed on two opposite sides of the first hole;
providing a MEMS wafer disposed under the cap wafer, comprising:
forming a three-stair structure, comprising:
forming a fourth surface corresponding the second wall portion of the cap wafer; and
forming a fifth surface corresponding the first wall portion of the cap wafer, wherein the fifth surface is parallel to and lower than the fourth surface;
providing an intermedium oxide layer sandwiched between the MEMS wafer and the cap wafer, wherein the intermedium oxide layer is sandwiched between and contacting the second wall portion of the cap wafer and the fourth surface of the MEMS wafer; and
sealing the second hole by using a sealing object including a metal layer which is free from filling into the second hole and an oxide layer including the portion disposed on the same plane with the metal layer;
wherein the first end links with the first cavity, and the first circumference is different from the second circumference, the second hole is defined between the second end and a third end with a third circumference, and the second circumference and the third circumference are smaller than the first circumference.

10. The method of claim 9, wherein providing the intermedium oxide layer sandwiched between the MEMS wafer and the cap wafer comprises:
forming a first oxide portion covering a bottom surface of the first wall portion, wherein the fifth surface is lower than a bottom surface of the first oxide portion.

11. The method of claim 10, wherein providing the MEMS wafer disposed under the cap wafer further comprises:
forming a spring structure, wherein the fifth surface is lower than a top surface of the spring structure.

12. The method of claim 11, wherein forming the three-stair structure further comprises:
forming a sixth surface parallel to and lower than the fourth surface and higher than the fifth surface.

13. The method of claim 12, wherein the bottom surface of the first oxide portion, the fourth surface and the top surface of the spring structure are at the same height.

14. The method of claim 12, wherein the first hole is right above the fifth surface and the sixth surface.

15. A semiconductor structure, comprising:
a complementary metal oxide semiconductor (CMOS) device; and
a micro-electro mechanical system (MEMS) device bonded to the CMOS device, a first chamber and a second chamber being defined between the CMOS device and the MEMS device, the first chamber having an atmospheric pressure, and the second chamber having a vacuum pressure, the MEMS device comprising:
a cap wafer, the cap wafer comprising a first wall portion and a second wall portion, the cap wafer defining:
a first hole, defined between a first end with a first circumference and a second end with a second circumference, the first and second wall portions disposed on two opposite sides of the first hole;
a second hole, disposed on the first hole, and aligned to the first hole, the second hole being smaller than the first hole;
a first cavity, included in the first chamber, the first wall portion disposed between the first cavity and the first hole, the first wall portion having a first surface facing the first hole, a second surface facing the first cavity, and a bottom surface connecting the first and second surfaces; and
a second cavity, included in the second chamber;
a MEMS wafer, disposed under the cap wafer, the MEMS wafer comprising:
a fourth surface facing the second wall portion of the cap wafer; and
a fifth surface facing the first wall portion of the cap wafer, wherein the fifth surface is lower than the fourth surface;
an intermedium oxide layer sandwiched between the MEMS wafer and the cap wafer, the intermedium oxide layer comprising a first oxide portion and a second oxide portion, the first oxide portion covering the bottom surface of the first wall, the second oxide portion sandwiched between and contacting the second wall portion of the cap wafer and the fourth surface of the MEMS wafer, wherein the first oxide portion sandwiched between the first cavity and the first hole is free from the MEMS wafer; and
a sealing object, for sealing the second hole, wherein the sealing object comprises a metal layer which is free from filling into the second hole, and an oxide layer including a portion disposed on a same plane with the metal layer;

wherein the first end links with the chamber, and the first circumference is different from the second circumference, the second hole is defined between the second end and a third end with a third circumference, and the second circumference and the third circumference are smaller than the first circumference.

16. The semiconductor structure of claim 15, wherein the first oxide portion directly faces the fifth surface.

17. The semiconductor structure of claim 16, wherein the fifth surface is lower than a bottom surface of the first oxide portion.

18. The semiconductor structure of claim 17, wherein the MEMS wafer comprises a spring structure, and the fifth surface is lower than a top surface of the spring structure.

19. The semiconductor structure of claim 18, wherein the MEMS wafer comprises a three-stair structure comprising the fourth surface, the fifth surface and a sixth surface, and the sixth surface is parallel to and lower than the fourth surface and higher than the fifth surface.

20. The semiconductor structure of claim 19, wherein the bottom surface of the first oxide portion, the fourth surface and the top surface of the spring structure are at the same height.

* * * * *